US012763020B2

(12) United States Patent
Kim

(10) Patent No.: US 12,763,020 B2
(45) Date of Patent: *Oct. 13, 2026

(54) DISPLAY DEVICE AND DRIVING METHOD THEREOF

(71) Applicant: LG Display Co., Ltd., Seoul (KR)

(72) Inventor: Jin Hun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/039,245

(22) Filed: Jan. 28, 2025

(65) Prior Publication Data

US 2025/0308451 A1 Oct. 2, 2025

(30) Foreign Application Priority Data

Mar. 29, 2024 (KR) ........................ 10-2024-0043284

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2340/0435* (2013.01)

(58) Field of Classification Search
CPC ..... H10K 59/00–95; G09G 2300/0819; G09G 2300/0233; G09G 2320/0233; G09G 3/3233; G09G 2300/043; G09G 2300/0861; G09G 3/30; G09G 3/3258; G09G 2320/045; G09G 2320/043; G09G 3/3291; G09G 3/32; G09G 3/3275; G09G 2300/0452; G09G 2320/0295; G09G 3/3208; G09G 2320/02
See application file for complete search history.

(56) References Cited

U.S. PATENT DOCUMENTS 11,151,941 B1 * 10/2021 Shikata ................ G09G 3/2092
12,175,936 B2 * 12/2024 Kim ..................... G09G 3/3233
(Continued)

FOREIGN PATENT DOCUMENTS

KR 10-2023-0046544 A 4/2023
KR 10-2023-0046699 A 4/2023
(Continued)

*Primary Examiner* — Sanjiv D. Patel
(74) *Attorney, Agent, or Firm* — Seed Intellectual Property Law Group LLP

(57) ABSTRACT

A display device includes a display panel including a subpixel having a light emitting device emitting light according to an on duty ratio of an emission control signal and a driving transistor supplying a driving current to the light emitting device, and a data line connected to the subpixel, a controller configured to obtain a compensation value for compensating for an abnormal luminance variation of the display panel based on coupling between a gate node of the driving transistor and the data line and correct a data signal which is to be written in the display panel, based on the compensation value, and a data driver configured to convert a corrected data signal into a data voltage and output the data voltage to the data line.

12 Claims, 21 Drawing Sheets

(56) References Cited

U.S. PATENT DOCUMENTS

| | | | | |
|---|---|---|---|---|
| 2016/0379571 | A1* | 12/2016 | Kim | G09G 3/3233 345/215 |
| 2023/0144298 | A1* | 5/2023 | Koo | G09G 3/3233 345/204 |
| 2024/0233615 | A1* | 7/2024 | Joo | G09G 3/32 |
| 2024/0321198 | A1* | 9/2024 | He | G09G 3/3233 |
| 2025/0148982 | A1* | 5/2025 | Baek | G09G 3/3233 |

FOREIGN PATENT DOCUMENTS

| | | | |
|---|---|---|---|
| KR | 10-2023-0092487 | A | 6/2023 |
| KR | 10-2023-0103342 | A | 7/2023 |

* cited by examiner

DISPLAY DEVICE AND DRIVING METHOD THEREOF

CROSS-REFERENCE TO RELATED APPLICATIONS

This application claims the benefit of the Korean Patent Application No. 10-2024-0043284 filed on Mar. 29, 2024, which is hereby incorporated by reference as if fully set forth herein.

BACKGROUND

Technical Field

The present disclosure relates to a display device and a driving method thereof.

Description of the Related Art

As information technology advances, the market for display device which are connection mediums between a user to information is growing. Therefore, the use of display device such as light emitting display device, quantum dot display (QDD) device, and liquid crystal display (LCD) device is increasing.

Display device includes a display panel which includes a plurality of subpixels, a driver which outputs a driving signal for driving the display panel, and a power supply which generates power which is to be supplied to the display panel or the driver. When the driving signal such as a scan signal and a data signal is supplied to the subpixels provided in the display panel, selected subpixels may emit light, and thus, brightness of a displayed image may be implemented. Each subpixel may include a driving transistor which generates a driving current and a light emitting device which emits light with the driving current.

BRIEF SUMMARY

To overcome the various technical problems found in the related art, various embodiments of the present disclosure may provide a display device and a driving method thereof, which may decrease a luminance deviation caused by coupling between a data line and a gate node of a driving transistor during a blank period.

To achieve these and other technical benefits and in accordance with the purpose of the disclosure, as embodied and broadly described herein, a display device includes: a display panel including a subpixel having a light emitting device emitting light according to an on duty ratio of an emission control signal and a driving transistor supplying a driving current to the light emitting device, and a data line connected to the subpixel; a controller configured to obtain a compensation value for compensating for an abnormal luminance variation of the display panel based on coupling between a gate node of the driving transistor and the data line and correct a data signal which is to be written in the display panel, based on the compensation value; and a data driver configured to convert a corrected data signal into a data voltage and output the data voltage to the data line.

In another aspect of the present disclosure, a driving method of a display device, based on a display panel including a subpixel having a light emitting device emitting light according to an on duty ratio of an emission control signal and a driving transistor supplying a driving current to the light emitting device, and a data line connected to the subpixel, includes: a step of obtaining a compensation value for compensating for an abnormal luminance variation of the display panel based on coupling between a gate node of the driving transistor and the data line and correcting a data signal which is to be written in the display panel, based on the compensation value; and a step of converting a corrected data signal into a data voltage and outputting the data voltage to the data line.

The present disclosure may reduce an emission time through EM PWM (pulse width modulation) driving and may increase a current flowing in a light emitting device, thereby decreasing luminance mura occurring in low-luminance driving.

Moreover, the present disclosure may effectively compensate for an abnormal luminance variation caused by coupling between a data line and a gate node of a driving transistor during a vertical blank period, and thus, may considerably improve display quality in a low-luminance optical band.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
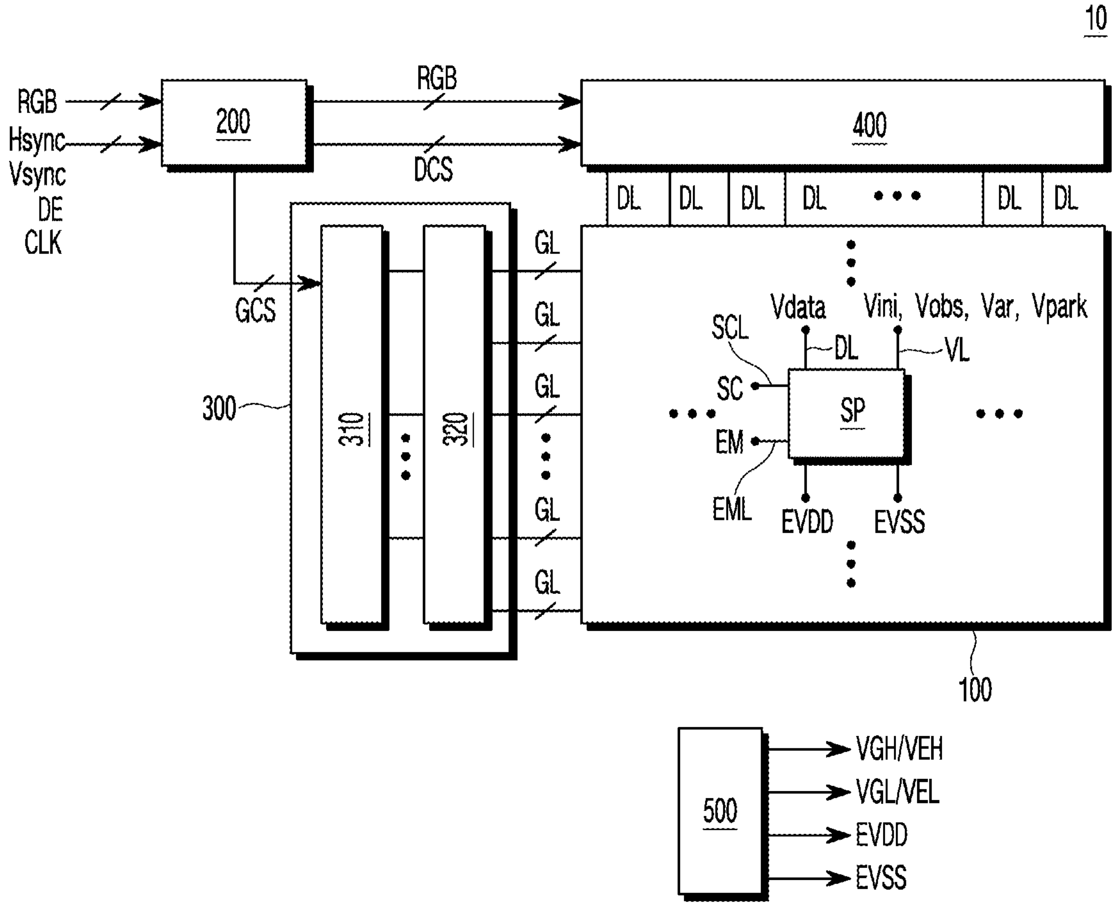
FIG. 1 is a block diagram schematically illustrating a display device according to the present disclosure.

As used herein, the terms "connected" and "coupled" are intended to be interpreted with the broadest possible meaning. Specifically, the phrase "A is connected to B" encompasses both a direct connection between A and B—where no intervening components or elements are present—as well as an indirect connection, where one or more intervening components or elements exist between A and B. Similarly, the term "coupled" should be understood in the same manner. For instance, "A is coupled to B" includes both a direct physical or electrical coupling and an indirect coupling facilitated through one or more intermediate components or elements. Unless expressly specified otherwise (e.g., "directly connected"), these terms do not imply or require direct physical contact.

Hereinafter, the present disclosure will be described more fully with reference to the accompanying drawings, in which exemplary embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art.

A display device according to the present disclosure may be implemented as a light emitting display device or a quantum dot display (QDD) device. Hereinafter, for convenience of description, a light emitting display device self-emitting light based on an inorganic light emitting diode or an organic light emitting diode will be described for example.

Moreover, a thin film transistor (TFT) described below may be implemented with an n-type TFT, a p-type TFT, or a combination of an n-type TFT and a p-type TFT. A TFT may be a three-electrode element including a gate, a source, and a drain. The source may be an electrode which provides a carrier to a transistor. In the TFT, a carrier may start to flow from the source. The drain may be an electrode where the carrier flows from the TFT to the outside. That is, in the TFT, the carrier flows from the source to the drain.

In the p-type TFT, because a carrier is a hole, a source voltage may be higher than a drain voltage so that the hole flows from the source to the drain. In the p-type TFT, because the hole flows from the source to the drain, a current may flow from the source to the drain. On the other hand, in the n-type TFT, because a carrier is an electron, a source voltage may be lower than a drain voltage so that the electron flows from the source to the drain. In the n-type TFT, because the electron flows from the source to the drain, a current may flow from the drain to the source. However, a source and a drain of a TFT may switch therebetween based on a voltage applied thereto. Based thereon, in the following description, one of a source and a drain will be described as a first electrode, and the other of the source and the drain will be described as a second electrode.

Figure 2:
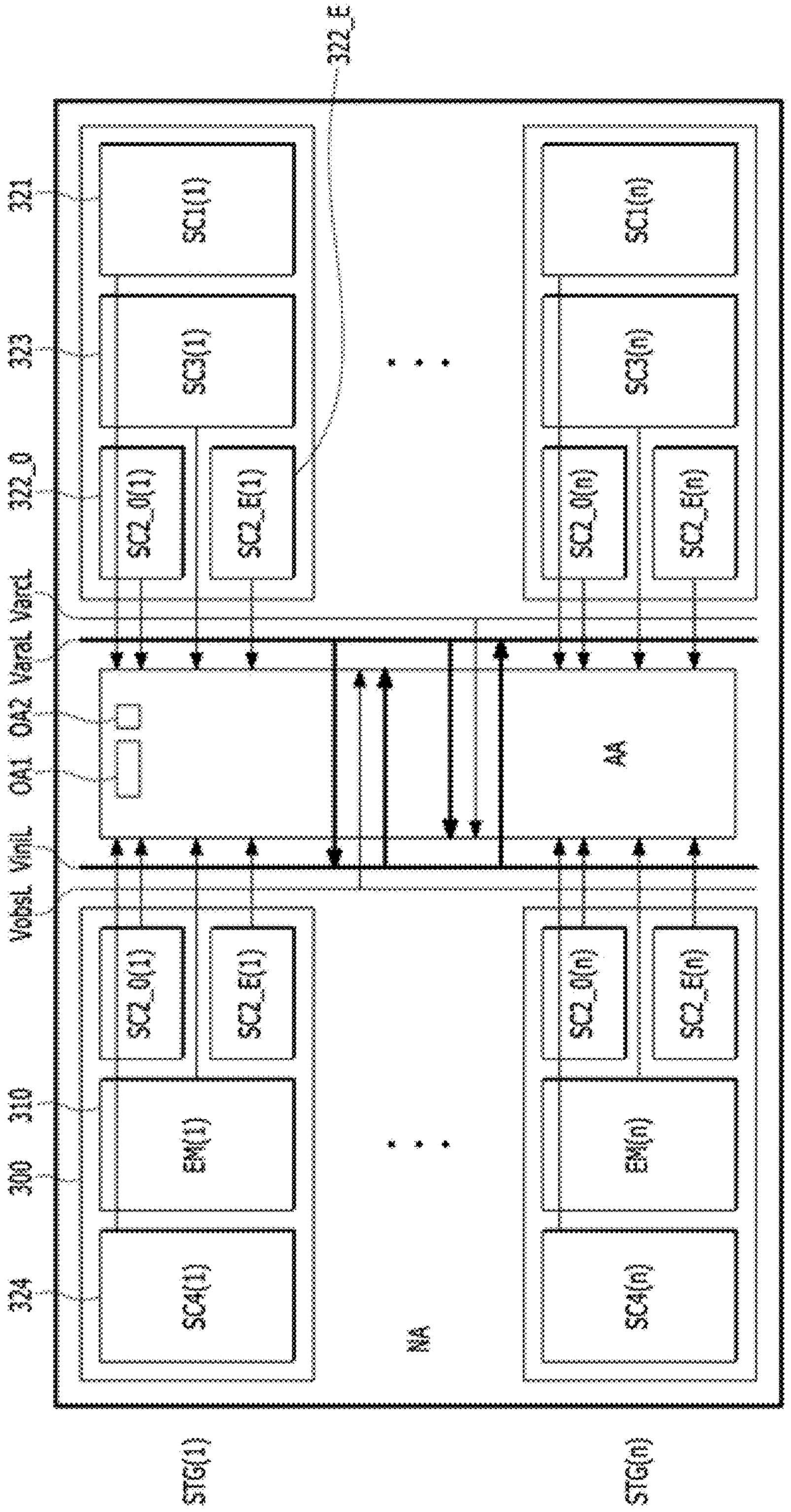
FIG. 2 is a block diagram illustrating an example of a gate driver in a display device according to the present disclosure.

FIG. 1 is a block diagram schematically illustrating a display device 10 according to the present disclosure. FIG. 2 is a block diagram illustrating an example of a gate driver in the display device 10 according to the present disclosure.

As illustrated in FIG. 1, the display device 10 may include a display panel 100 which includes a plurality of subpixels SP, a controller 200, a gate driver 300 which supplies a gate signal to the plurality of subpixels SP, a data driver 400 which supplies a data signal (or a data voltage) to the plurality of subpixels SP, and a power supply 500 which supplies power to the plurality of subpixels SP.

The display panel 100 may include a display area (see AA of FIG. 2) where the plurality of subpixels SP are provided and a non-display area (see NA of FIG. 2) which is disposed to surround the display area AA and where the gate driver 300 and the data driver 400 are disposed.

In the display panel 100, a plurality of gate lines GL and a plurality of data lines DL may intersect with one another, and each of the plurality of subpixels SP may be connected to a gate line GL and a data line DL. In detail, one subpixel SP may be supplied with a gate signal from the gate driver 300 through the gate line GL, may be supplied with a data signal from the data driver 400 through the data line DL, and may be supplied with a high-level voltage EVDD and a low-level voltage EVSS from the power supply 500.

The gate line GL may transfer a scan signal SC and an emission control signal EM to the plurality of subpixels SP, and the data line DL may transfer a data voltage Vdata to the plurality of subpixels SP. According to various embodiments, the gate line GL may include a plurality of scan lines SCL for supplying the scan signal SC and a plurality of emission control lines EML for supplying the emission control signal EM. The plurality of subpixels SP may be supplied with voltages Vini, Var, Vobs, and Vpark through a plurality of voltage lines VL. The voltages Vini, Var, Vobs, and Vpark applied through the plurality of voltage lines VL will be described below.

Each of the plurality of subpixels SP may include a subpixel driving circuit. The subpixel driving circuit may include a plurality of switching elements, a driving element, and a capacitor. The switching element and the driving element may each be configured as a TFT. A switching transistor may be turned on based on the scan signal SC supplied through the scan line SCL and the emission control signal EM supplied through the emission control line EML. A driving transistor may control the amount of current (control the amount of emitted light) supplied to a light emitting device OLED, based on the data voltage Vdata.

The display panel 100 may be implemented as a non-transmissive display panel or a transmissive display panel.

The transmissive display panel may be applied to a transparent display device which displays an image on a screen thereof and enables a real thing of a background to be seen. The display panel 100 may be implemented as a flexible display panel. The flexible display panel may be a plastic substrate. Each of the plurality of subpixels SP may be divided into a red subpixel, a green subpixel, and a blue subpixel for color implementation. Each of the plurality of subpixels SP may further include a white subpixel.

Touch sensors may be further disposed in the display panel 100, so as to sense a touch input. The touch sensors may be arranged as an on-cell type or an add-on type in a screen of the display panel 100, or may be implemented as in-cell type touch sensors embedded in the display panel 100. Also, the touch input may be sensed through the plurality of subpixels SP without separate touch sensors.

The controller 200 may process image data RGB input from the outside to supply to the data driver 400, based on a size and a resolution of the display panel 100. The controller 200 may generate a gate control signal GCS and a data control signal DCS by using synchronization signals (for example, a dot clock signal CLK, a data enable signal DE, a horizontal synchronization signal Hsync, and a vertical synchronization signal Vsync) input from the outside. The controller 200 may supply the gate control signal GCS to the gate driver 300 to control an operation timing of the gate driver 300. The controller 200 may supply the data control signal DCS to the data driver 400 to control an operation timing of the data driver 400. The controller 200 may synchronize the operation timing of the gate driver 300 with the operation timing of the data driver 400 by using the gate control signal GCS and the data control signal DCS.

The controller 200 may be configured to be coupled to various processors (for example, a microprocessor, a mobile processor, and an application processor), based on a device mounted thereon. A host system disposed at a previous end with respect to the controller 200 may be one of a television (TV) system, a set-top box, a navigation system, a personal computer (PC), a home theater system, a mobile device, a wearable device, and an automotive system.

The controller 200 may drive the display panel 100 at various refresh rates. A refresh rate may be referred to as a frame frequency. A refresh rate may be defined as an inverse number of a time interval (i.e., one refresh period) between adjacent refresh frames. The controller 200 may drive the display panel 100 in a variable refresh rate (VRR) mode, namely, the refresh rate of the display panel 100 is switchable between a first refresh rate and a second refresh rate.

In the VRR mode, a length of a vertical blank period (or, blank time) may vary based on a refresh rate, and a length of a vertical active period (or, active time) may be fixed regardless of a variable refresh rate. The vertical blank period may be fixed with respect to a highest refresh rate of predetermined refresh rates and may be set to progressively increase as a refresh rate is lowered. The vertical active period may be defined as a period where a data signal is input to the display panel 100. On the other hand, the vertical blank period may be defined as a period where an input of a data signal to the display panel 100 stops.

Moreover, the controller 200 may simply change a speed of a clock signal, or may generate a synchronization signal so that a horizontal blank or a vertical blank occurs, or may drive the gate driver 300 in a mask mode, thereby driving the display panel 100 at various refresh rates. The vertical blank period may be repeated at one frame period, and various signals for an operation of the display device may be synchronized with one another during a corresponding period.

A voltage level of the gate control signal GCS output from the controller 200 may be shifted to a gate on voltage VGL (VEL) and a gate off voltage VGH (VEH) by a level shifter (not shown) and may be supplied to the gate driver 300. The level shifter may shift a low level voltage of the gate control signal GCS to a gate low voltage VGL and may shift a high level voltage of the gate control signal GCS to a gate high voltage VGH. The gate control signal GCS may include a start signal and a clock signal.

The gate driver 300 may supply the gate signal to the gate line GL, based on the gate control signal GCS supplied from the controller 200. The gate driver 300 may be disposed at one side or both sides of the display panel 100 in a gate in panel (GIP) form.

The gate driver 300 may sequentially output the gate signal to the plurality of gate lines GL, based on control by the controller 200. The gate driver 300 may shift the gate signal by using a shift register, and thus, may sequentially supply the gate signals to the gate lines GL.

The gate signal may include the scan signal SC and the emission control signal EM. The scan signal SC may include a scan signal which swings between the gate on voltage VGL and the gate off voltage VGH. The emission control signal EM may include an emission control signal which swings between a gate on voltage VEL and a gate off voltage VEH. The scan signal SC may select subpixels SP of a pixel line in which a data voltage Vdata is to be written. The emission control signal EM may define an emission time of each of the subpixels SP.

The gate driver 300 may include an emission control driver 310 and one or more scan drivers 320. The emission control driver 310 may output the emission control signal in response to a start signal and a shift clock from the controller 200 and may sequentially shift the emission control signal according to the shift clock. The one or more scan drivers 320 may output the scan signal in response to the start signal and the shift clock from the controller 200 and may shift the scan signal, based on a shift clock timing.

The data driver 400 may convert the image data RGB into data voltages Vdata, based on the data control signal DCS supplied from the controller 200, and may output the data voltages Vdata to the data lines DL.

In FIG. 1, it is illustrated that a single data driver 400 is disposed at one side of the display panel 100, but the number and arrangement positions of data drivers 400 are not limited thereto. That is, the data driver 400 may be configured with a plurality of integrated circuits (ICs) and may be provided in plurality, and the plurality of data drivers 400 may be divided and arranged at both sides of the display panel 100.

The power supply 500 may generate a direct current (DC) power needed for driving of the display panel driver and a subpixel array of the display panel 100 by using a DC-DC converter. The DC-DC converter may include a charge pump, a regulator, a buck converter, and a boost converter. The power supply 500 may receive a DC input voltage applied from the host system (not shown) to generate DC voltages such as the gate on voltage VGL (VEL), the gate off voltage VGH (VEH), the high-level voltage EVDD, and the low-level voltage EVSS. The gate on voltage VGL (VEL) and the gate off voltage VGH (VEH) may be supplied to the level shifter (not shown) and the gate driver 300. The high-level voltage EVDD and the low-level voltage EVSS may be supplied to the plurality of subpixels SP in common.

As illustrated in FIGS. 1 and 2, the gate driver 300 may include the emission control driver 310 and the scan driver 320. The scan driver 320 may include first to fourth scan drivers 321 to 324. Also, the second scan driver 322 may include odd-numbered second scan drivers 322_O and even-numbered second scan drivers 322_E.

Shift registers configuring the gate driver 300 may be configured to be symmetric at both sides of the display area AA. The shift register of one side of the display area AA may include second scan drivers 322_O and 322_E, the fourth scan driver 324, and the emission control driver 310, and the shift register of the other side of the display area AA may include the first scan driver 321, second scan drivers 322_O and 322_E, and the third scan driver 323. In FIG. 2, an example is illustrated where the odd-numbered second scan driver 322_O and the even-numbered second scan driver 322_E have a structure where an odd-numbered subpixel and an even-numbered subpixel share the second scan driver 322. An arrangement configuration of the emission control driver 310 and the first to fourth scan drivers 321 to 324 is not limited to FIG. 2. The arrangement configuration of the emission control driver 310 and the first to fourth scan drivers 321 to 324 may be implemented unlike FIG. 2.

Stages STG1 to STGn of the shift register may respectively include a plurality of first scan signal generators 321, a plurality of second scan signal generators 322_O and 322_E, a plurality of third scan signal generators 323, a plurality of fourth scan signal generators 324, and a plurality of emission control signal generators 310.

The first scan signal generators 321 may respectively output first scan signals SC1(1) to SC1(*n*) through first scan lines of the display panel 100. The second scan signal generators 322_O and 322_E may respectively output second scan signals SC2_O(1) to SC2_O(n) and SC2_E(1) to SC2_E(n) through second scan lines of the display panel 100. The third scan signal generators 323 may respectively output third scan signals SC3(1) to SC3(*n*) through third scan lines of the display panel 100. The fourth scan signal generators 324 may respectively output fourth scan signals SC4(1) to SC4(*n*) through fourth scan lines of the display panel 100. The emission control signal generators 310 may respectively output emission control signals EM(1) to EM(n) through emission lines EML of the display panel 100.

The first scan signals SC1(1) to SC1(*n*) may be used as a signal for driving an Ath transistor (for example, a compensation transistor) included in the subpixel driving circuit. The second scan signals SC2(1) to SC2(*n*) may be used as a signal for driving a Bth transistor (for example, a data supply transistor) included in the subpixel driving circuit. The third scan signals SC3(1) to SC3(*n*) may be used as a signal for driving a Cth transistor (for example, a bias transistor) included in the subpixel driving circuit. The fourth scan signals SC4(1) to SC4(*n*) may be used as a signal for driving a Dth transistor (for example, an initialization transistor) included in the subpixel driving circuit. The emission control signals EM(1) to EM(n) may be used as a signal for driving an Eth transistor (for example, an emission control transistor) included in the subpixel driving circuit. For example, when the emission control transistor is controlled by using the emission control signals EM(1) to EM(n), an emission time of a light emitting device may vary.

Meanwhile, the configuration and output of the gate driver 300 described above are only an example and may vary depending on the subpixel driving circuit. For example, a subpixel driving circuit SP shown in FIGS. 5 and 10 may be supplied with a first scan signal SC1(*n*), a second scan signal SC2(*n*), a third scan signal SC3(*n*), a fourth scan signal SC4(*n*), and an emission control signal EM(n) for pixel driving. In contrast, a subpixel driving circuit SP shown in FIGS. 11 and 12 may be supplied with a previous first scan signal SC1(*n*−1), a first scan signal SC1(*n*), a third scan signal SC3(*n*), and an emission control signal EM(n) for pixel driving.

A bias voltage line VobsL transferring a second bias voltage Vobs, a first initialization voltage line ViniL transferring a first initialization voltage Vini, and a second initialization voltage line VaraL transferring a second initialization voltage Var may be disposed between the gate driver 300 and the display area AA.

In the drawing, each of the bias voltage line VobsL, the first initialization voltage line ViniL, and the second initialization voltage line VaraL is illustrated as being disposed at one side of a left side or a right side of the display area AA, but is not limited thereto and may be disposed at both sides, or even when being disposed at one side, a position is not limited to the left side or the right side.

Furthermore, one or more optical regions OA1 and OA2 may be disposed in the display area AA. The optical regions OA1 and OA2 may be disposed to overlap one or more optical electronic devices such as an imaging device such as a camera (an image sensor) and a sensing sensor such as a proximity sensor and an illumination sensor.

The optical regions OA1 and OA2 may have a light transmissive structure, for an operation of an optical electronic device, and thus, may have a transmittance of a certain level or more. When the other region, except the optical regions OA1 and OA2, of the display area AA is assumed to be a normal region, the number of pixels per inch (PPI) in the optical regions OA1 and OA2 may be less than an PPI of the normal region. That is, a resolution of each of the optical regions OA1 and OA2 may be lower than that of the normal region.

In the optical regions OA1 and OA2, the light transmissive structure may be configured by patterning a cathode electrode in a portion where a subpixel is not disposed. In this case, the patterned cathode electrode may be removed by using a laser, or by using a material such as a cathode deposition prevention layer, the cathode electrode may be selectively formed and patterned.

Moreover, in the optical regions OA1 and OA2, the light transmissive structure may be configured by separately forming a light emitting device and a subpixel driving circuit included in a subpixel. In other words, the light emitting device of the subpixel may be disposed in the optical regions OA1 and OA2, and a plurality of transistors configuring the subpixel driving circuit may be disposed near the optical regions OA1 and OA2, and thus, the light emitting device may be electrically connected to the subpixel driving circuit through a transparent metal layer.

Figure 3:
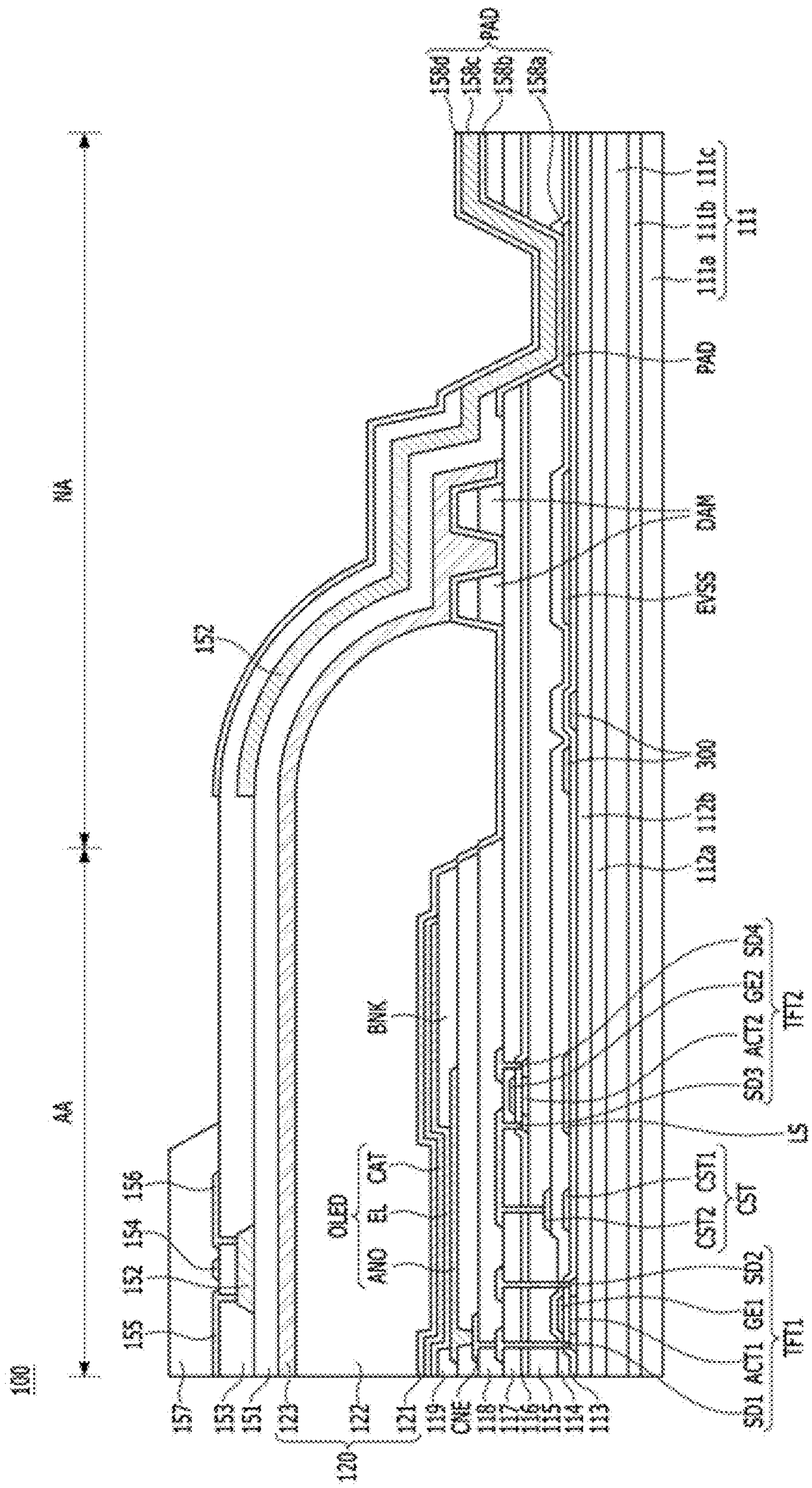
FIG. 3 is a diagram illustrating a stack structure of a display panel according to an embodiment of the present disclosure.

FIG. 3 is a diagram illustrating a stack structure of a display panel 100 according to an embodiment of the present disclosure.

As illustrated in FIG. 3, transistors TFT1 and TFT2 and a capacitor CST for driving a light emitting device OLED may be disposed in a display area AA on a substrate 111 of the display panel 100. One of the transistors TFT1 and TFT2 may include a thin film transistor including a polycrystalline semiconductor material, and the other thereof may be a thin film transistor including an oxide semiconductor material. A thin film transistor including a polycrystalline semiconductor material may be referred to as a polycrystalline thin film transistor TFT1, and a thin film transistor including an oxide semiconductor material may be referred to as an oxide thin film transistor TFT2. For example, the polycrystalline thin film transistor may be a transistor TFT1 connected to the light emitting device OLED, and the oxide thin film transistor may be a transistor TFT2 connected to the capacitor CST.

The substrate 111 may include a first substrate layer 111*a*, a second substrate layer 111*b*, and a third substrate layer 111*c*. The first substrate layer 111*a* and the third substrate layer 111*c* may be selected as an organic layer including polyimide, and the second substrate layer 111*b* disposed between the first substrate layer 111*a* and the third substrate layer 111*c* may be selected as an inorganic layer including oxide silicon ($SiO_2$). The second substrate layer 111*b* configured as an inorganic layer may be effective for preventing the penetration of water from the outside.

A lower buffer layer 112*a* may be formed on the substrate 111. The lower buffer layer 112*a* may be for preventing the penetration of water from the outside and may be an oxide silicon ($SiO_2$) layer which is stacked as a multilayer. An auxiliary buffer layer 112*b* may be further disposed on the lower buffer layer 112*a*, so as to protect elements from the penetration of water.

The polycrystalline thin film transistor TFT1 may be formed on the substrate 111. The polycrystalline thin film transistor TFT1 may use a polycrystalline semiconductor as an active layer. The polycrystalline thin film transistor TFT1 may include a first active layer ACT1 including a channel through which an electron or a hole moves, a first gate electrode GE1, a first source electrode SD1, and a first drain electrode SD2. A first gate insulation layer 113 may be disposed between the first gate electrode GE1 and the first active layer ACT1 and may be an inorganic layer such as nitride silicon ($SiN_x$) or a $SiO_2$ layer, which is stacked as a single layer or a multiplayer.

The first active layer ACT1 may include a first channel region, a first source region disposed at one side with respect to the first channel region, and a first drain region disposed at the other side with respect to the first channel region. The first source region and the first drain region may each be a region which is conductive by doping a Group 5 or 3 impurity ion (for example, phosphorus (P) or boron (B)) in an intrinsic polycrystalline semiconductor material at a certain concentration. The first channel region may allow a polycrystalline semiconductor material to maintain an intrinsic state and may provide a path through which an electron or a hole moves.

According to an embodiment, the polycrystalline thin film transistor TFT1 may be implemented in a top gate structure where the first gate electrode GE1 is disposed on the first active layer ACT1. Accordingly, a first electrode CST1 included in the capacitor CST and a light blocking layer LS included in the oxide thin film transistor TFT2 may be formed of the same material as that of the first gate electrode GE1 in the same layer. The first gate electrode GE1, the first electrode CST1, and the light blocking layer LS may be formed through one mask process, thereby reducing the number of mask processes.

The first gate electrode GE1 may include a metal material. For example, the first gate electrode GE1 may be a single layer or a multilayer including one of molybdenum (Mo), aluminum (Al), chrome (Cr), gold (Au), titanium (Ti), nickel (Ni), neodymium (Nd), and copper (Cu), or an alloy thereof, but is not limited thereto. A first interlayer insulation layer 114 may be disposed on the first gate electrode GE1. The first interlayer insulation layer 114 may be formed of $SiO_2$ or $SiN_x$.

The display panel 100 may further include an upper buffer layer 115, a second gate insulation layer 116, and a second interlayer insulation layer 117, which are sequentially disposed on the first interlayer insulation layer 114, and the polycrystalline thin film transistor TFT1 may include a first source electrode SD1 and a first drain electrode SD2, which are formed on the second interlayer insulation layer 117 and are respectively connected to the first source region and the first drain region.

The first source electrode SD1 and the first drain electrode SD2 of the polycrystalline thin film transistor TFT1 may be a single layer or a multilayer including one of Mo, Al, Cr, Au, Ti, Ni, Nd, and Cu, or an alloy thereof, but are not limited thereto.

The upper buffer layer 115 may separate the second active layer ACT2 of the oxide thin film transistor TFT2, formed of an oxide semiconductor material, from the first active layer ACT1 formed of a polycrystalline semiconductor material and may provide a basis for forming the second active layer ACT2.

The second gate insulation layer 116 may cover the second active layer ACT2 of the oxide thin film transistor TFT2. The second gate insulation layer 116 may be formed on the second active layer ACT2 formed of an oxide semiconductor material, and thus, may be formed of an inorganic layer. For example, the second interlayer insulation layer 116 may be formed of $SiO_2$ or $SiN_x$.

The second gate electrode GE2 may be formed of a metal material. For example, the second gate electrode GE2 may be a single layer or a multilayer including one of Mo, Al, Cr, Au, Ti, Ni, Nd, and Cu, or an alloy thereof, but is not limited thereto.

The oxide thin film transistor TFT2 may be formed on the upper buffer layer 115. The oxide thin film transistor TFT2 may include a second active layer ACT2 formed of an oxide semiconductor material, a second gate electrode GE2 disposed on the second gate insulation layer 116, and a second source electrode SD3 and a second drain electrode SD4 which are disposed on the second interlayer insulation layer 117. The second active layer ACT2 may be formed of an oxide semiconductor material and may include an intrinsic second channel region which is not doped with impurities and a second source region and a second drain region which are conductive by doping impurities.

The oxide thin film transistor TFT2 may further include a light blocking layer LS which is disposed under the upper buffer layer 115 to overlap the second active layer ACT2. The light blocking layer LS may prevent light from being incident on the second active layer ACT2 and may thus prevent an abnormal operation of the oxide thin film transistor TFT2. The light blocking layer LS may be formed of the same material as that of the first gate electrode GE1 and may be disposed on an upper surface of the first gate insulation layer 113. The light blocking layer LS may be electrically connected to the second gate electrode GE2 to configure a dual gate.

The second source electrode SD3 and the second drain electrode SD4 may be simultaneously formed of the same material on the second interlayer insulation layer 117 along with the first source electrode SD1 and the first drain electrode SD2, and thus, may reduce the number of mask processes.

Furthermore, the second electrode CST2 may be disposed on the first interlayer insulation layer 114 to overlap the first electrode CST1, and thus, the capacitor CST may be constituted. The second electrode CST2 may be, for example, a single layer or a multilayer including one of Mo, Al, Cr, Au, Ti, Ni, Nd, and Cu, or an alloy thereof.

The capacitor CST may store a data voltage, applied through a data line DL, during a certain period. The capacitor CST may include two electrodes corresponding to each other and a dielectric disposed therebetween. The first interlayer insulation layer 114 may be disposed between the first electrode CST1 and the second electrode CST2.

The first electrode CST1 or the second electrode CST2 of the capacitor CST may be electrically connected to the second source electrode SD3 or the second drain electrode SD4 of the oxide thin film transistor TFT2. However, an embodiment is not limited thereto, and a connection relationship of the capacitor CST may be changed based on a subpixel driving circuit.

A first planarization layer 118 and a second planarization layer 119 for planarizing a surface may be sequentially disposed on the substrate 111 where the transistors TFT1 and TFT2 and the capacitor CST are formed. The first planarization layer 118 and the second planarization layer 119 may each be an organic layer such as polyimide or acrylic resin. The light emitting device OLED may be formed on the second planarization layer 119.

The light emitting device OLED may include an anode electrode ANO, a cathode electrode CAT, and an emission layer EL disposed between the anode electrode ANO and the cathode electrode CAT. In a subpixel driving circuit which uses in common a low-level voltage connected to the cathode electrode CAT, the anode electrode ANO may be separated and patterned for each subpixel. On the other hand, in a subpixel driving circuit which uses in common a high-level voltage, the cathode electrode CAT may be separated and patterned for each subpixel.

The light emitting device OLED may be electrically connected to a driving element through a connecting electrode CNE disposed on the first planarization layer 118. For example, the anode electrode ANO of the light emitting device OLED and the first source electrode SD1 of the polycrystalline thin film transistor TFT1 configuring the subpixel driving circuit may be connected to each other by the connecting electrode CNE.

The anode electrode ANO may be connected to the connecting electrode CNE exposed through a contact hole passing through the second planarization layer 119. The connecting electrode CNE may be connected to the first source electrode SD1 exposed through a contact hole passing through the first planarization layer 118.

The connecting electrode CNE may function a medium which connects the first source electrode SD1 to the anode electrode ANO. The connecting electrode CNE may include a conductive material such as Cu, Ag, Mo, or Ti.

The anode electrode ANO may be formed in a multi-layer structure including a transparent conductive layer and an opaque conductive layer which is high in reflection efficiency. The transparent conductive layer may include a material, which is relatively large in work function value, such as indium tin oxide (ITO) or indium zinc oxide (IZO), and the opaque conductive layer may be formed in a single-layer or multi-layer structure which includes Al, Ag, Cu, lead (Pb), Mo, or Ti, or an alloy thereof. For example, the anode electrode ANO may be formed in a structure where a transparent conductive layer, an opaque conductive layer, and a transparent conductive layer are sequentially stacked, or may be formed in a structure where a transparent conductive layer and an opaque conductive layer are sequentially stacked. The emission layer EL may be formed by stacking a hole-related layer, an organic emission layer, and an electron-related layer on the anode electrode ANO in order or reverse order.

A bank layer BNK may be a subpixel definition layer which exposes the anode electrode ANO of each subpixel. The bank layer BNK may be formed of an opaque material (for example, black) so as to prevent light interference between adjacent subpixels. In this case, the bank layer BNK may include a light blocking material including at least one of a color pigment, organic black, and carbon.

The cathode electrode CAT may be formed on an upper surface and a lateral surface of the emission layer EL so as to be opposite to the anode electrode ANO with the emission layer EL therebetween. The cathode electrode CAT may be formed as one body to cover all of the display area AA. In a case where the cathode electrode CAT is applied to an organic light emitting display device of a top emission type, the cathode electrode CAT may include a transparent conductive layer such as ITO or IZO.

An encapsulation layer 120 for preventing the penetration of water may be further disposed on the cathode electrode CAT. The encapsulation layer 120 may prevent the penetration of external water or oxygen into the emission layer EL vulnerable to external water or oxygen. To this end, the encapsulation layer 120 may include an at least one-layer inorganic encapsulation layer and an at least one-layer organic encapsulation layer, but is not limited thereto. The encapsulation layer 120 may include a first encapsulation layer 121, a second encapsulation layer 122, and a third encapsulation layer 123, which are sequentially stacked.

The first encapsulation layer 121 and the third encapsulation layer 123 may include an inorganic insulating material, which is capable of low temperature deposition, such as $SiN_x$, $SiO_x$, oxynitride silicon (SiON), or oxide aluminum ($Al_2O_3$). The first encapsulation layer 121 and the third encapsulation layer 123 may be deposited in a low temperature atmosphere, and thus, may prevent the damage of the emission layer EL vulnerable to a high temperature atmosphere when performing a deposition process of the first encapsulation layer 121 and the third encapsulation layer 123.

The second encapsulation layer 122 may perform a buffer function of decreasing a stress between layers caused by the bending of the display device 10 and may planarize a step height between layers. The second encapsulation layer 122 may be formed on the substrate 111 where the first encapsulation layer 121 is formed and may include acryl resin, epoxy resin, phenolic resin, polyamide resin, polyimide resin, and polyethylene, or a non-photosensitive organic insulating material such as silicon oxycarbon (SiOC), or a photosensitive organic insulating material such as photo acryl, but an embodiment is not limited thereto.

In a case where the second encapsulation layer 122 is formed through an inkjet process, a dam DAM may be disposed to prevent the second encapsulation layer 122 of a liquid state from being diffused to an edge of the substrate 111. The dam DAM may be disposed closer to the edge of the substrate 111 than the second encapsulation layer 122. The dam DAM may prevent the second encapsulation layer 122 from being diffused to a pad region where a conductive pad is disposed at an outermost portion of the substrate 111.

The dam DAM may be designed to prevent the diffusion of the second encapsulation layer 122, but in a case where the second encapsulation layer 122 is formed to flow over a height of the dam DAM when performing a process, the second encapsulation layer 122 which is an organic layer may be exposed at the outside, and due to this, there may be a possibility that water penetrates into the light emitting device OLED. Accordingly, in order to solve such a problem, the dam DAM may be provided in plurality to overlap each other.

The dam DAM may be disposed on the second interlayer insulation layer 117 of a non-display area NA. The dam DAM may be formed simultaneously with the first planarization layer 118 and the second planarization layer 119. The first planarization layer 118 may be formed along with a lower layer of the dam DAM, and the second planarization layer 119 may be formed along with an upper layer of the dam DAM, and thus, the dam DAM may be stacked and formed in a double layer structure. As described above, the dam DAM may include the same material as that of the first planarization layer 118 and the second planarization layer 119, but an embodiment is not limited thereto.

The dam DAM may be formed to overlap a low-level voltage line EVSS. For example, the low-level voltage line EVSS may be disposed in a lower layer of a region, where the dam DAM is disposed, of the non-display area NA. The low-level voltage line EVSS may be disposed more outward than the gate driver 300 and may surround the display area AA. For example, the low-level voltage line EVSS may include the same material as that of the first gate electrode GE1, but is not limited thereto and may include the same material as that of the second electrode CST2 or the first source electrode SD1 and the first drain electrode SD2. The low-level voltage line EVSS may be electrically connected to the cathode electrode CAT so as to apply the low-level voltage EVSS to a plurality of subpixels included in the display area AA.

A touch layer may be disposed on the encapsulation layer 120. In the touch layer, a touch buffer layer 151 may be disposed between the cathode electrode CAT of the light emitting device OLED and a touch sensor metal layer including touch electrodes 155 and 156 and touch electrode connection lines 152 and 154.

The touch buffer layer 151 may prevent external water or a chemical solution (for example, a developer or an etchant), which is used in a manufacturing process of the touch sensor metal layer disposed on the touch buffer layer 151, from penetrating into the emission layer EL including an organic material. Accordingly, the touch buffer layer 151 may prevent the damage of the emission layer EL vulnerable to the chemical solution or water.

The touch buffer layer 151 may include an organic insulating material which has a low dielectric constant of 1 to 3 and is capable of being formed at a low temperature of a certain temperature (for example, 100° C.) or less, so as to prevent the damage of the emission layer EL including an organic material vulnerable to a high temperature. For example, the touch buffer layer 151 may include an acrylic material, an epoxy-based material, or a siloxan-based material. The touch buffer layer 151 which includes an organic insulating material and has planarization performance may prevent the damage of the encapsulation layer 120 caused by the bending of an device and the breakage of the touch sensor metal layer formed on the touch buffer layer 151.

According to a touch sensor structure based on a mutual capacitance, the touch electrodes 155 and 156 may be disposed on the touch buffer layer 151, and the touch electrodes 155 and 156 may be disposed to intersect with each other. The touch electrode connection lines 152 and 154 may electrically connect the touch electrodes 155 and 156 with each other. The touch electrode connection lines 152 and 154 and the touch electrodes 155 and 156 may be disposed in different layers with the touch insulation layer 153 therebetween. The touch electrode connection lines 152 and 154 may be disposed to overlap the bank layer BNK and may prevent a reduction in aperture ratio.

In the touch electrodes 155 and 156, a portion of the touch electrode connection line 152 may pass through an upper portion and a lateral surface of the encapsulation layer 120 and an upper portion and a lateral surface of the dam DAM and may be electrically connected to a touch driving circuit (not shown) through a touch pad PAD. A portion of the touch electrode connection line 152 may be supplied with a touch driving signal from a touch driving circuit and may transfer the touch driving signal to the touch electrodes 155 and 156, or may transfer touch sensing signals of the touch electrodes 155 and 156 to the touch driving circuit.

A touch protection layer 157 may be disposed on the touch electrodes 155 and 156. In the drawings, the touch protection layer 157 is illustrated as being disposed on only the touch electrodes 155 and 156, but an embodiment is not limited thereto and the touch protection layer 157 may extend up to a previous portion or a next portion with respect to the dam DAM and may be disposed on the touch electrode connection line 152. Moreover, a color filter (not shown) may be further disposed on the encapsulation layer 120, and the color filter may be disposed on the touch layer or may be disposed between the encapsulation layer 120 and the touch layer.

Figure 4:
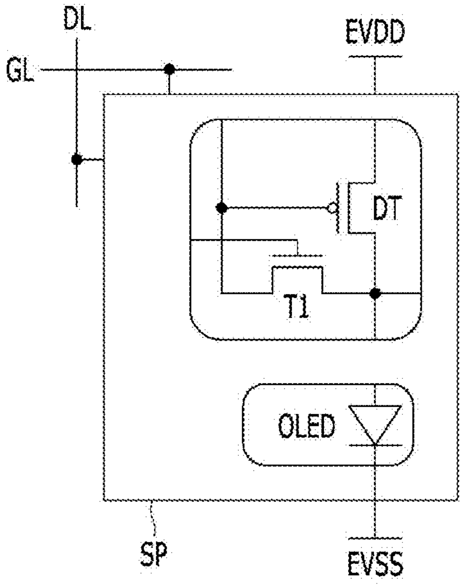
FIG. 4 is a schematic circuit diagram of a subpixel according to an embodiment of the present disclosure.

FIG. 4 is a schematic circuit diagram of a subpixel SP according to an embodiment of the present disclosure.

Referring to FIG. 4, the subpixel SP may include a driving transistor DT, a first transistor DT, and a light emitting device OLED. The driving transistor DT may be implemented as a polycrystalline thin film transistor of a p type. A p-type driving transistor DT may be turned on in response to a low voltage. The first transistor T1 may be formed of an oxide thin film transistor of an n type. An n-type driving transistor DT may be turned on in response to a high voltage. The light emitting device OLED may emit light with a driving current generated based on an operation of the driving transistor DT and the first transistor T1.

The subpixel SP may further include a compensation circuit for compensating for the driving transistor DT or the light emitting device OLED. The compensation circuit may be variously configured.

Figure 5:
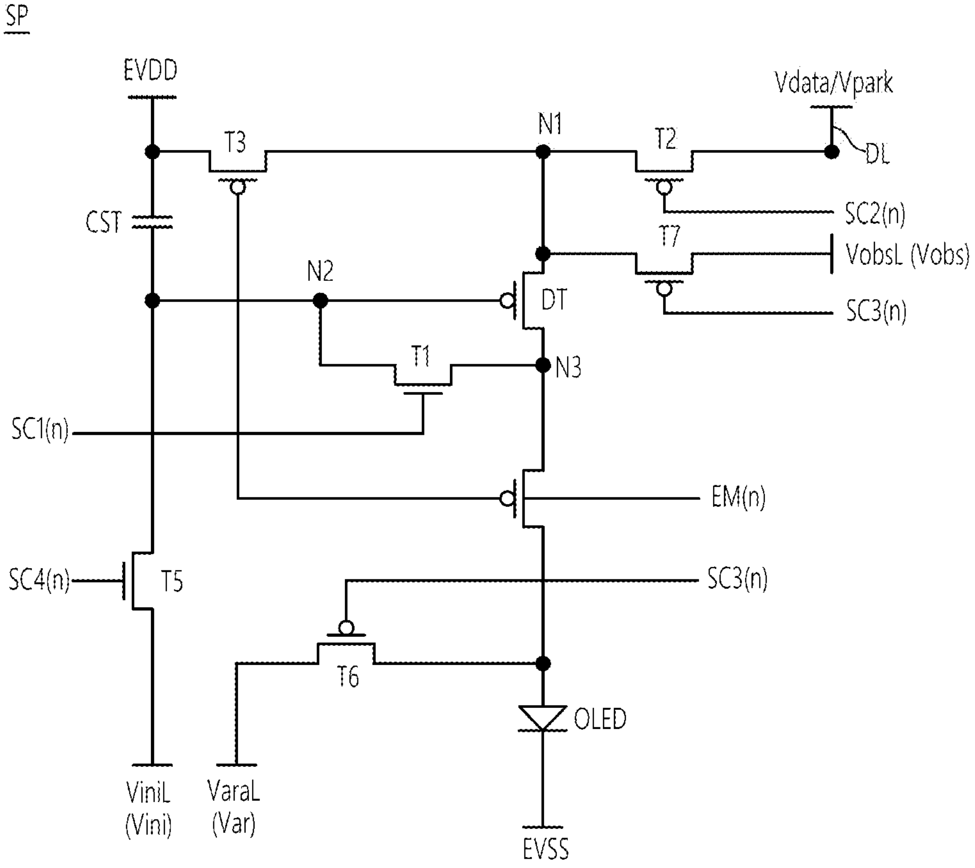
FIG. 5 is a circuit diagram of a subpixel according to an embodiment of the present disclosure.
Figure 6:
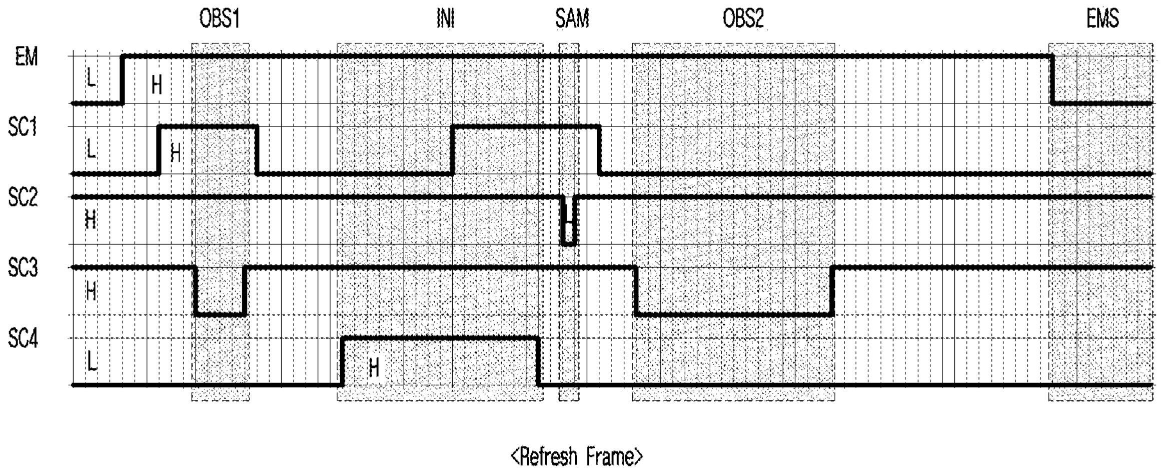
FIGS. 6 and 7 are driving waveform diagrams applied to the subpixel of FIG. 5.
Figure 7:
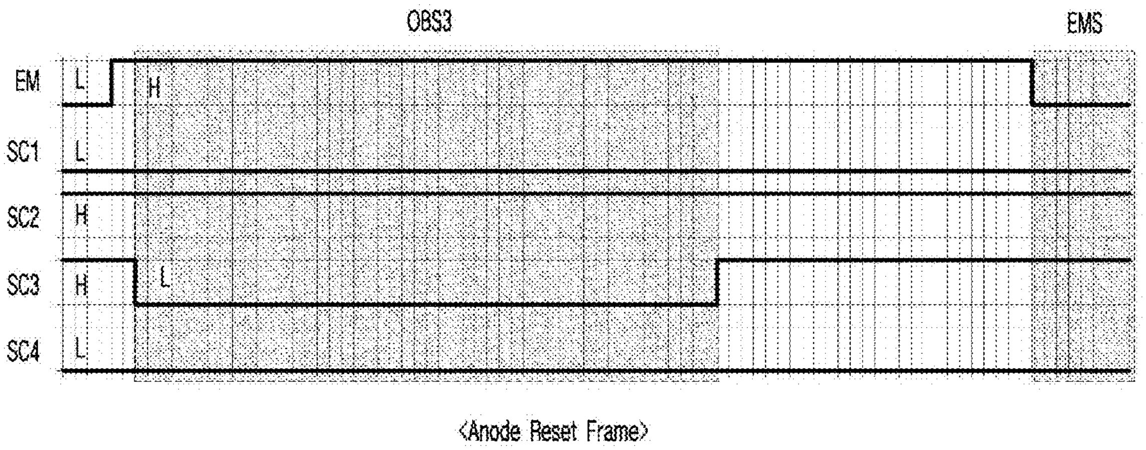
Figure 8:
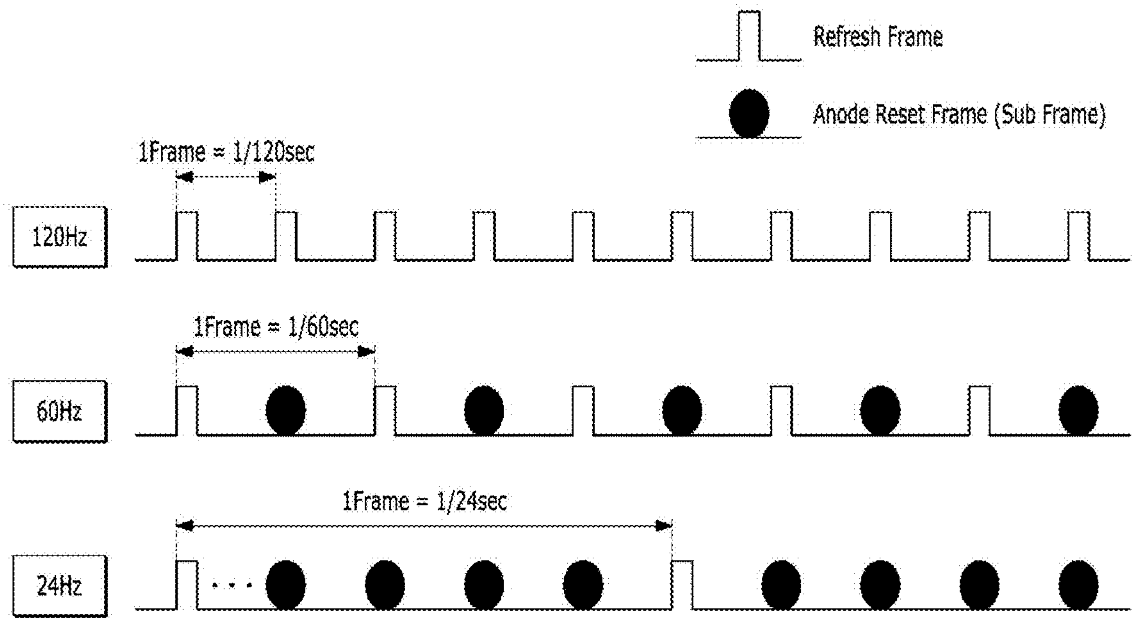
FIG. 8 is a diagram illustrating variable refresh rate (VRR) driving of the subpixel of FIG. 5.

FIG. 5 is a circuit diagram of a subpixel SP according to an embodiment of the present disclosure. FIGS. 6 and 7 are driving waveform diagrams applied to the subpixel SP of FIG. 5. FIG. 8 is a diagram illustrating VRR driving of the subpixel SP of FIG. 5.

Referring to FIG. 5, the subpixel SP may include a first transistor T1, a second transistor T2, a third transistor T3, a fourth transistor T4, a fifth transistor T5, a sixth transistor T6, a seventh transistor T7, a driving transistor DT, a capacitor CST, and a light emitting device OLED. In FIG. 5, the first transistor T1 and the fifth transistor T5 may each be implemented as an oxide thin film transistor of an n type, and the second transistor T2, the third transistor T3, the fourth transistor T4, the sixth transistor T6, the seventh transistor T7, and the driving transistor DT may each be implemented as a polycrystalline thin film transistor of a p type. Hereinafter, such a composite structure may be referred to as MTO.

In a subpixel SP of an MTO structure, because the first and fifth transistors T1 and T5 implemented as an oxide thin film transistor have a low leakage current characteristic, low-speed refresh rate driving of the subpixel SP may be possible, and thus, power consumption may be reduced. However, FIG. 5 is merely an embodiment of the subpixel SP of the MTO structure, and the embodiment is not limited to FIG. 5.

In the subpixel SP of the MTO structure, low-speed refresh rate driving may be possible, based on a low leakage current characteristic of an oxide thin film transistor. To decrease flickers in low-speed driving and reduce an optical characteristic difference between different frequencies, a first bias voltage Vpark and a second bias voltage Vobs may be further applied to the subpixel SP. Each of the first bias voltage Vpark and the second bias voltage Vobs may be a direct current (DC) voltage which is fixed to a specific voltage level.

The first transistor T1 may include a gate electrode to which a first scan signal SC1(*n*) is applied, a first electrode connected to a second node N2, and a second electrode connected to a third node N3. The first transistor T1 may be turned on in response to the first scan signal SC1(*n*). While the first transistor T1 is being turned on, a threshold voltage of the driving transistor DT may be sampled and stored in the second node N2.

The second transistor T2 may include a gate electrode to which an input terminal of a second scan signal SC2(*n*) applied, a first electrode connected to a data line DL, and a second electrode connected to a first node N1. The second transistor T2 may be turned on in response to the second scan signal SC2(*n*). When the second transistor T2 is turned on, a data voltage Vdata charged in the data line DL may be applied to the first node N1. A voltage of the data line DL may be toggled from the data voltage Vdata to the first bias voltage Vpark in the vertical blank period, and thus, may contribute to adjust luminance.

The third transistor T3 may include a gate electrode to which an emission control signal EM(n) is applied, a first electrode connected to a high-level voltage line EVDD, and a second electrode connected to the first node N1. The third transistor T3 may be turned on in response to the emission control signal EM(n). When the third transistor T3 is turned on, a high-level voltage applied through the high-level voltage line EVDD may be transferred to the first node N1.

The fourth transistor T4 may also be referred to as an emission control transistor and include a gate electrode to which the emission control signal EM(n) is applied, a first electrode connected to the third node N3, and a second electrode connected to an anode electrode of the light emitting device OLED. The fourth transistor T4 may be turned on in response to the emission control signal EM(n). When the fourth transistor T4 is turned on, a driving current generated from the driving transistor DT may be applied to the light emitting device OLED. The light emitting device OLED may emit light, based on the driving current applied from the driving transistor DT.

The fifth transistor T5 may include a gate electrode to which a fourth scan signal SC4(*n*) is applied, a first electrode connected to a first initialization voltage line ViniL, and a second electrode connected to the second node N2. The fifth transistor T5 may be turned on in response to the fourth scan signal SC4(*n*). When the fifth transistor T5 is turned on, a first initialization voltage Vini applied through the first initialization voltage line ViniL may be transferred to the second node N2. When the fifth transistor T5 is turned on, an electric charge remaining in each of a second electrode of the capacitor CST and the gate electrode of the driving transistor DT connected to the second node N2 may be initialized.

The sixth transistor T6 may include a gate electrode to which a third scan signal SC3(*n*) is applied, a first electrode connected to a second initialization voltage line VaraL, and a second electrode connected to the anode electrode of the light emitting device OLED. The sixth transistor T6 may be turned on in response to the third scan signal SC3(*n*). When the sixth transistor T6 is turned on, a second initialization voltage Var applied through the second initialization voltage line VaraL may be transferred to the anode electrode of the light emitting device OLED. When the sixth transistor T6 is turned on, an electric charge remaining in the anode electrode of the light emitting device OLED may be initialized.

The seventh transistor T7 may include a gate electrode to which the third scan signal SC3(*n*) is applied, a first electrode connected to a second bias voltage line VobsL, and a second electrode connected to the first node N1. The seventh transistor T7 may be turned on in response to the third scan signal SC3(*n*). When the seventh transistor T7 is turned on, a second bias voltage Vobs applied through the second bias voltage line VobsL may be transferred to the first node N1. When the seventh transistor T7 is turned on, the driving transistor DT connected to the first node N1 may maintain a stronger saturation state, based on the second bias voltage Vobs. Based on an on bias stress operation, a hysteresis of the driving transistor DT may be alleviated.

As a level of the second bias voltage Vobs for the on bias stress operation increases, a voltage of the third node N3 which is a drain electrode of the driving transistor DT may increase, and a gate-source voltage or a drain-source voltage of the driving transistor DT may decrease. Therefore, it may be preferable that a level of the second bias voltage Vobs is at least higher than that of the data voltage Vdata. Under such a condition, a stress of the driving transistor DT and a magnitude of a drain-source current Id passing through the driving transistor DT may be reduced, and thus, the charge delay of the third node N3 may be solved. When the on bias stress operation is performed before and after sampling the threshold voltage of the driving transistor DT, the hysteresis of the driving transistor DT may be more alleviated.

The driving transistor DT may include a gate electrode connected to the second node N2, a first electrode connected to the first node N1, and a second electrode connected to the third node N3. The driving transistor DT may be driven based on the data voltage Vdata where a threshold voltage has been compensated for and may thus generate the driving current.

The capacitor CST may include a first electrode connected to the high-level voltage line EVDD and the second electrode connected to the second node N2. The capacitor CST may store the data voltage Vdata, where the threshold voltage has been compensated for, for a certain time.

The light emitting device OLED may include the anode electrode connected to the second electrode of the fourth transistor T4 and a cathode electrode connected to a low-level voltage line EVSS. The light emitting device OLED may emit light, based on the driving current transferred to the turned-on fourth transistor T4.

In the VRR mode, some of a plurality of frames driving the display panel 100 may be a refresh frame where a data programming operation is performed, and the other frames may be an anode reset frame where an anode reset operation is performed.

Referring to FIGS. 1, 5, and 6, a refresh frame may include a first bias period OBS1, an initialization period INI, a sampling period SAM, a second bias period OBS2, and an emission period EMS.

During the first bias period OBS1, the emission control signal EM, the first scan signal SC1, and the second scan signal SC2 may be applied as a high voltage H, and the third scan signal SC3 and the fourth scan signal SC4 may be applied as a low voltage L. During the first bias period OBS1, the sixth and seventh transistors T6 and T7 may be turned on, and the other transistors may be turned off.

During the first bias period OBS1, the second bias voltage Vobs may be applied to the first electrode (or the first node) of the driving transistor DT, and the second initialization voltage Var may be applied to the anode electrode of the light emitting device OLED. Before the sampling period SAM, when the second bias voltage Vobs is directly applied to the first electrode of the driving transistor DT, the hysteresis of the driving transistor DT may be alleviated.

During the initialization period INI, the emission control signal EM, the second scan signal SC2, the third scan signal SC3, and the fourth scan signal SC4 may be applied as a high voltage H, and the first scan signal SC1 may be applied as a low voltage L and may then be applied as a high voltage H. During the initialization period INI, the fifth transistor T5 may be turned on.

During the initialization period INI, the first initialization voltage Vini may be applied to the second node N2, and the gate electrode of the driving transistor DT and the second electrode of the capacitor CST may be initialized to the first initialization voltage Vini.

During the sampling period SAM, the emission control signal EM, the first scan signal SC1, and the third scan signal SC3 may be applied as a high voltage H, and the second scan signal SC2 and the fourth scan signal SC4 may be applied as a low voltage L. During the sampling period SAM, the first and second transistors T1 and T2 and the driving transistor DT may be turned on, and the other transistors may be turned off.

During the sampling period SAM, the data voltage Vdata charged in the data line DL may be transferred to the second node N2 via the second transistor T2, the driving transistor DT, and the first transistor T1. In such a process, a threshold voltage Vth of the driving transistor DT may be sampled and may be reflected in a voltage of the second node N2. During the sampling period SAM, the gate electrode and the second electrode of the driving transistor DT may be put in a diode connection state, and the voltage of the second node N2 may be set to "Vdata−|Vth|," based on the data voltage Vdata and the threshold voltage Vth of the driving transistor DT.

During the second bias period OBS2, the emission control signal EM, the first scan signal SC1, and the second scan signal SC2 may be applied as a high voltage H, and the third scan signal SC3 and the fourth scan signal SC4 may be applied as a low voltage L. During the second bias period OBS2, the sixth and seventh transistors T6 and T7 may be turned on, and the other transistors may be turned off.

During the second bias period OBS2, the second bias voltage Vobs may be again applied to the first electrode (or the first node) of the driving transistor DT, and the second initialization voltage Var may be again applied to the anode electrode of the light emitting device OLED. After the sampling period SAM is performed, when the second bias voltage Vobs is again applied to the first electrode of the driving transistor DT, the hysteresis of the driving transistor DT may be more alleviated.

During the emission period EMS, the emission control signal EM, the first scan signal SC1, and the fourth scan signal SC4 may be applied as a low voltage L, and the second scan signal SC2 and the third scan signal SC3 may be applied as a high voltage H. During the emission period EMS, the third and fourth transistors T3 and T4 and the driving transistor DT may be turned on, and the other transistors may be turned off.

During the emission period EMS, the driving current flows through the driving transistor DT may be irrelevant to the threshold voltage Vth of the driving transistor DT. The driving current may be applied to the light emitting device OLED through the fourth transistor T4 to allow the light emitting device OLED to emit light.

Furthermore, referring to FIGS. 1, 5, and 7, the anode reset frame may include a third bias period OBS3 and the emission period EMS.

During the third bias period OBS3, the emission control signal EM and the second scan signal SC2 may be applied as a high voltage H, and the first scan signal SC1, the third scan signal SC3, and the fourth scan signal SC4 may be applied as a low voltage L. During the third bias period OBS3, the sixth and seventh transistors T6 and T7 may be turned on, and the other transistors may be turned off.

During the third bias period OBS3, the second bias voltage Vobs may be applied to the first electrode (or the first node) of the driving transistor DT, and the second initialization voltage Var may be applied to the anode electrode of the light emitting device OLED.

During the third bias period OBS3, the light emitting device OLED may stop to emit light, based on the second initialization voltage Var applied to the anode electrode of the light emitting device OLED. Based on the third bias period OBS3, a problem may be solved where the luminance of the anode reset frame is higher than that of a refresh frame.

During the emission period EMS, the emission control signal EM, the first scan signal SC1, and the fourth scan signal SC4 may be applied as a low voltage L, and the second scan signal SC2 and the third scan signal SC3 may be applied as a high voltage H. During the emission period EMS, the third and fourth transistors T3 and T4 and the driving transistor DT may be turned on, and the other transistors may be turned off.

During the emission period EMS, the driving current flows through the driving transistor DT may be irrelevant to the threshold voltage Vth of the driving transistor DT. The driving current may be applied to the light emitting device OLED through the fourth transistor T4 to allow the light emitting device OLED to emit light.

Referring to FIGS. 1 and 8, the display panel 100 may operate in the VRR mode. VRR may be a driving mode where a display panel is driven at a certain driving frequency, and then, increases or decreases a refresh rate needed for updating a data voltage Vdata, based on a high-speed driving or low-speed driving condition, thereby reducing power consumption. For example, in the VRR mode, the display panel 100 may be driven at 120 Hz (1Frame=1/120 sec), or may be driven at 60 Hz (1Frame=1/60 sec), or may be driven at 24 Hz (1Frame=1/24 sec). Also, in the VRR mode, the display panel 100 may be driven at 10 Hz (1Frame=1/10 sec), or may be driven at 1 Hz (1Frame=1 sec).

Under a high-speed driving condition such as 120 Hz, each frame may be configured with a refresh frame. Under a 60 Hz driving condition, each frame may be configured with one refresh frame and one anode reset frame. Under a 24 Hz driving condition, each frame may be configured with one refresh frame and four anode reset frames.

In the refresh frame, the data voltage Vdata may be written in the display panel 100, and based thereon, a gate-source voltage of the driving transistor DT may be set. On the other hand, an operation of writing the data voltage Vdata in the display panel 100 may be omitted in the anode reset frame. Accordingly, the anode reset frame may be referred to as a skip frame.

The anode reset frame may be a sub-frame which completes one frame. The anode reset frame may be implemented under a condition (for example, a low-speed driving condition) where there is hardly a motion of an image, or a still image is displayed. The gate-source voltage of the driving transistor which is set in the refresh frame may be continuously maintained in the anode reset frame.

Moreover, the display device according to the present disclosure may drive the display panel, by a driving method (herein defined as "EM PWM") which increases the driving current applied to the light emitting device instead of decreasing a time (herein defined as "EM On time") for which the light emitting device is driven, based on the emission control signal EM in one frame.

In a case where the display panel 100 is driven with low luminance without EM PWM driving, a low driving current may flow through the light emitting device. In this case, the light emitting device may not sufficiently be charged for a time (herein defined as "EM Off time") for which the light emitting device is not driven. Due to this, a pixel (or a subpixel) emitting light having luminance which is lower than desired luminance may occur in the display panel, and luminance mura may occur in low-luminance driving.

On the other hand, when EM PWM driving is performed, an EM On time may be reduced, and the light emitting device may be sufficiently charged by a high driving current flowing for a short time. Accordingly, desired luminance may be more easily implemented in EM PWM driving than a case where the other driving is performed, and particularly, luminance mura occurring in low-luminance driving may be more easily reduced.

Figure 9A:
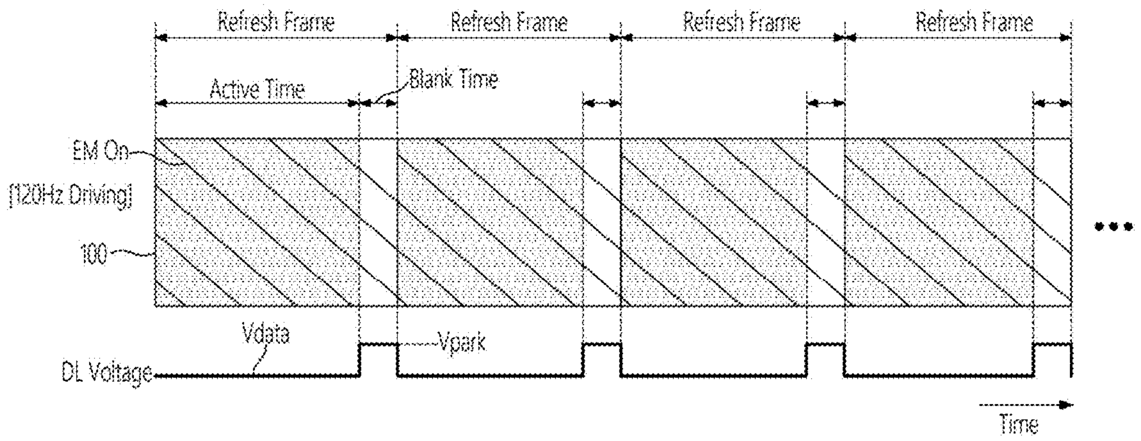
FIGS. 9A and 9B are diagrams illustrating an example where, in VRR driving, the number of voltage variations of a data line is changed based on a refresh rate.
Figure 9B:
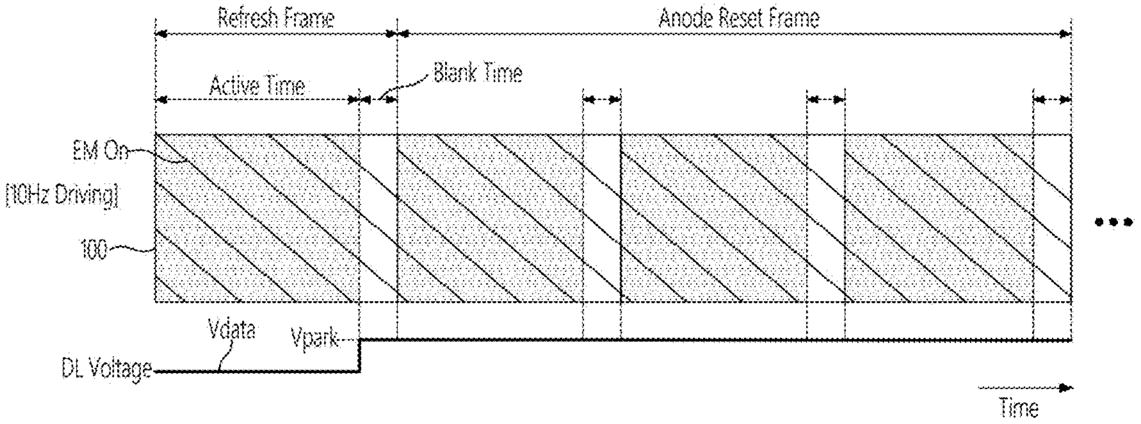

FIGS. 9A and 9B are diagrams illustrating an example where, in VRR driving, the number of voltage variations of a data line is changed based on a refresh rate.

Referring to FIGS. 9A and 9B, the number of voltage variations of a data line based on a refresh rate in VRR driving may be relatively more under a high-speed driving condition.

For example, in FIG. 9A, when a frame frequency is 120 Hz, each frame may be configured with a refresh frame. The refresh frame may include a vertical active period and a vertical blank period. A voltage of a data line may maintain a data voltage Vdata in the vertical active period and may then be toggled to a first bias voltage Vpark in the vertical blank period. When the frame frequency is 120 Hz, the number of times a voltage of the data line is toggled from the data voltage Vdata to the first bias voltage Vpark may be 12.

In another example, in FIG. 9B, when the frame frequency is 10 Hz, each frame may be divided into one refresh frame and eleven anode reset frames. The data voltage Vdata may be maintained in the vertical active period of the refresh frame and may then be toggled to the first bias voltage Vpark in the vertical blank period of the refresh frame. Also, the voltage of the data line may maintain the first bias voltage Vpark in the eleven anode reset frames. When the frame frequency is 10 Hz, the number of times the voltage of the data line is toggled from the data voltage Vdata to the first bias voltage Vpark may be 1.

The first bias voltage Vpark may be a DC voltage which is fixed to a specific voltage level, but the data voltage Vdata may vary in a plurality of optical bands and a plurality of gray levels. Accordingly, a level of the first bias voltage Vpark may be greater than that of the data voltage Vdata, or may be less than that of the data voltage Vdata.

Figure 10:
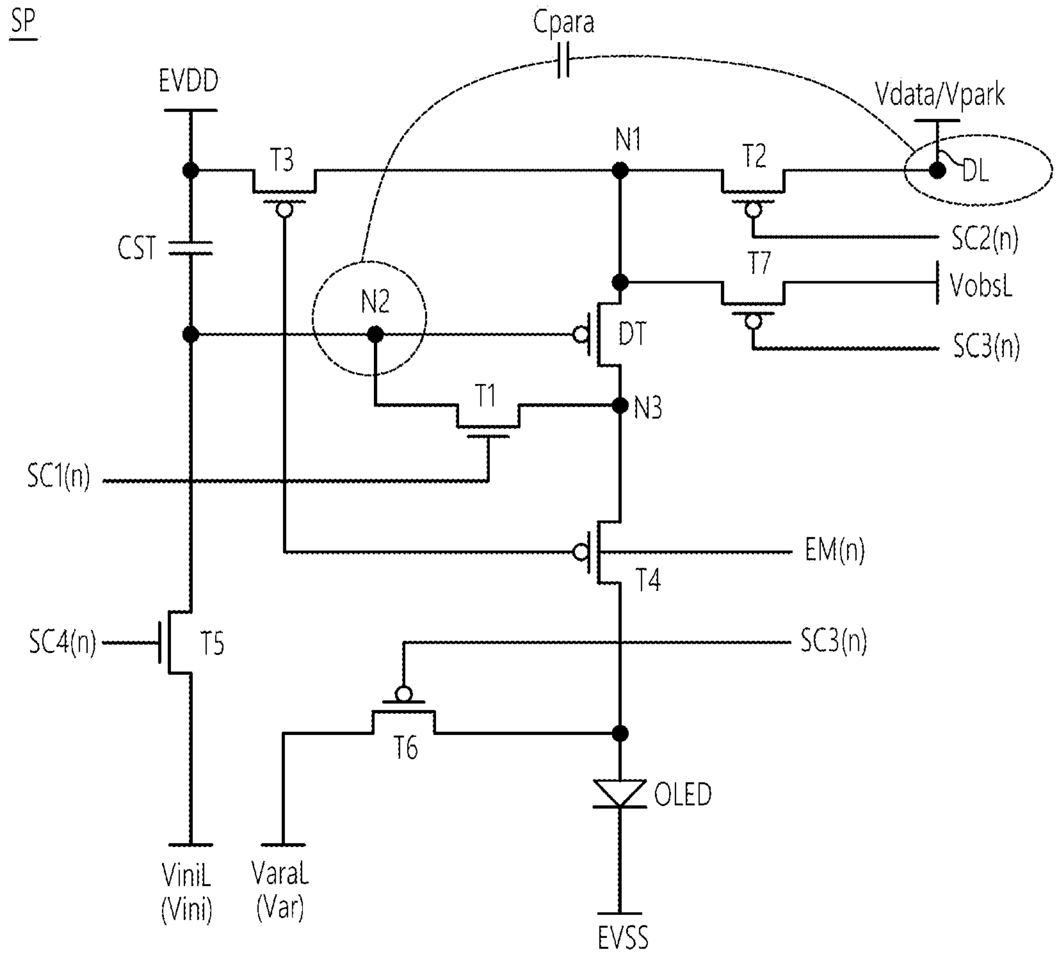
FIG. 10 is a diagram illustrating an example where a voltage variation of a data line is reflected in a voltage of a gate node of a driving transistor in the subpixel of FIG. 5, based on a coupling effect.

FIG. 10 is a diagram illustrating an example where a voltage variation of a data line is reflected in a voltage of a gate node of a driving transistor in the subpixel of FIG. 5, based on a coupling effect.

Referring to FIG. 10, a gate node (e.g., a second node N2) of a driving transistor and a data line DL may be disposed to overlap each other with one or more insulation layers therebetween. A parasitic capacitor Cpara may be formed at a position at which the second node N2 overlaps the data line DL.

In a subpixel SP circuit of the MTO structure, a first bias voltage Vpark for VRR driving may be applied to the data line DL during an anode reset frame and a vertical blank period of a refresh frame. As the first bias voltage Vpark is applied, a voltage of the data line DL may be toggled from the data voltage Vdata to the first bias voltage Vpark. At this time, because the data line DL is coupled to a second node N2 through the parasitic capacitor Cpara, a gate voltage of the driving transistor may vary by a voltage variation of the data line.

When the gate voltage of the driving transistor varies in the vertical blank period of the refresh frame, horizontal band mura (herein defined as "HBM") may occur in a screen of the display panel 100. Horizontal band mura may be a type of luminance distortion and may denote block dim having a band shape.

Figure 11:
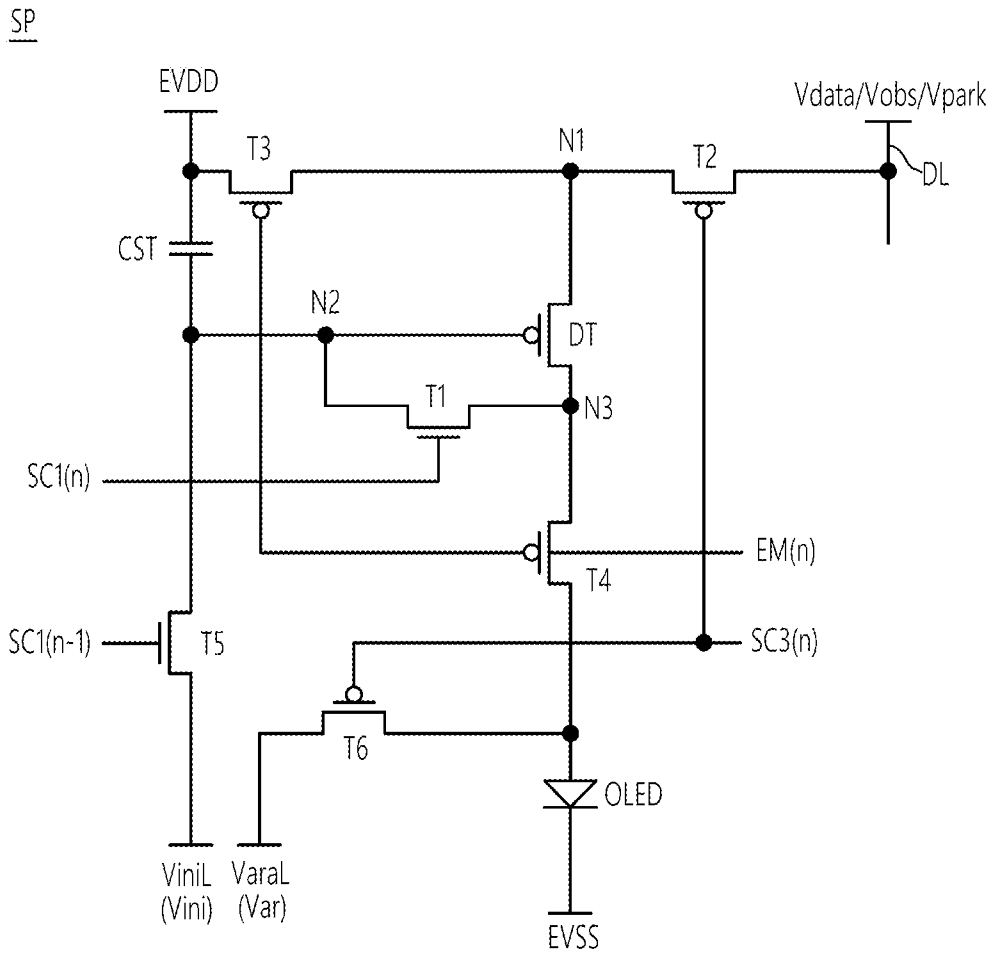
FIG. 11 is a circuit diagram of a subpixel according to another embodiment of the present disclosure.
Figure 12:
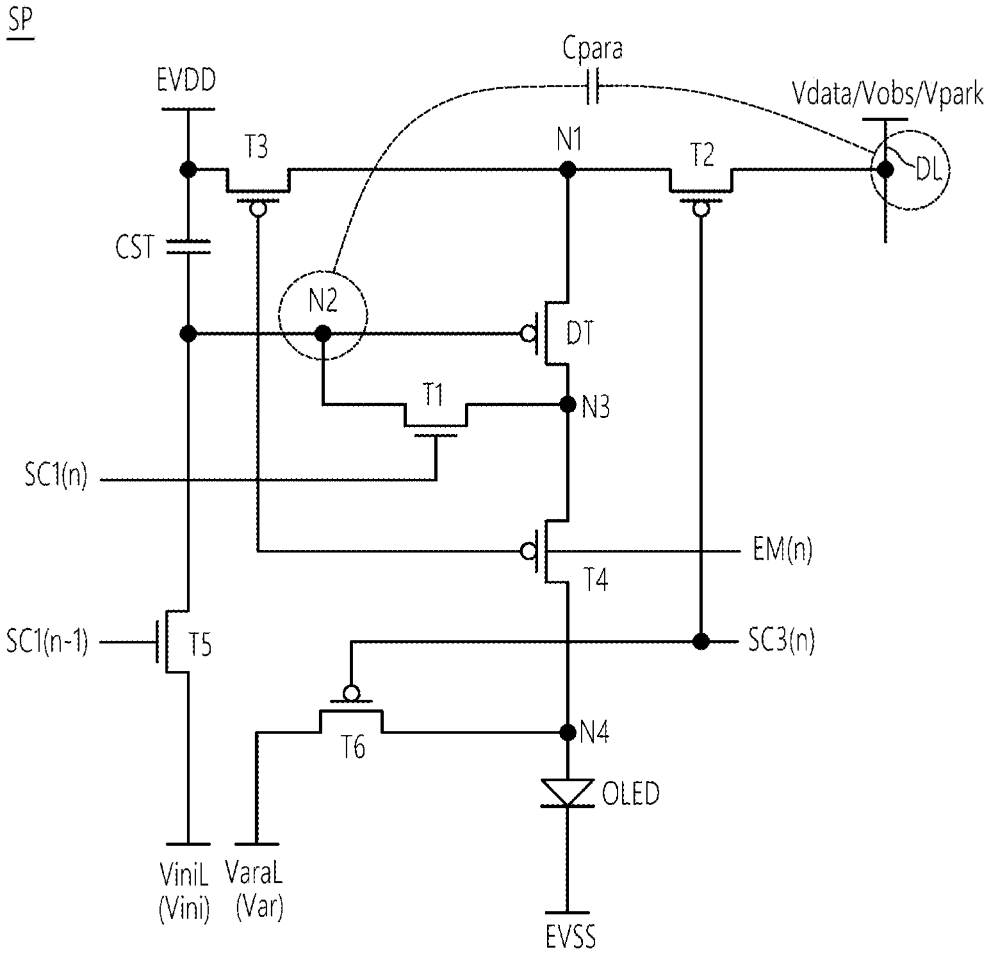
FIG. 12 is a diagram illustrating an example where a voltage variation of a data line is reflected in a voltage of a gate node of a driving transistor in the subpixel of FIG. 11, based on a coupling effect.

FIG. 11 is a circuit diagram of a subpixel according to another embodiment of the present disclosure. FIG. 12 is a diagram illustrating an example where a voltage variation of a data line is reflected in a voltage of a gate node of a driving transistor in the subpixel of FIG. 11, based on a coupling effect.

Comparing with FIG. 10, a subpixel SP circuit of FIGS. 11 and 12 may differ in that i) the seventh transistor T7 is omitted, ii) the fifth transistor T5 is turned on in response to a previous first scan signal SC1(*n*−1), iii) the second transistor T2 and the sixth transistor T6 are turned on in response to the third scan signal SC3(*n*), and iv) the data voltage Vdata and the first and second bias voltages Vpark and Vobs are time-divisionally supplied to the subpixel circuit through the data line.

Referring to FIGS. 11 and 12, in a subpixel SP circuit of the MTO structure, a first bias voltage Vpark for VRR driving may be applied to a data line DL during an anode reset frame and a vertical blank period of a refresh frame. As the first bias voltage Vpark is applied, a voltage of the data line DL may be toggled from a data voltage Vdata to the first bias voltage Vpark. At this time, because the data line DL is coupled to a second node N2 through a parasitic capacitor Cpara, a gate voltage of a driving transistor may vary by a voltage variation of the data line. When the gate voltage of the driving transistor varies in the vertical blank period of the refresh frame, HBM may also occur in a screen of the display panel 100.

Figure 13:
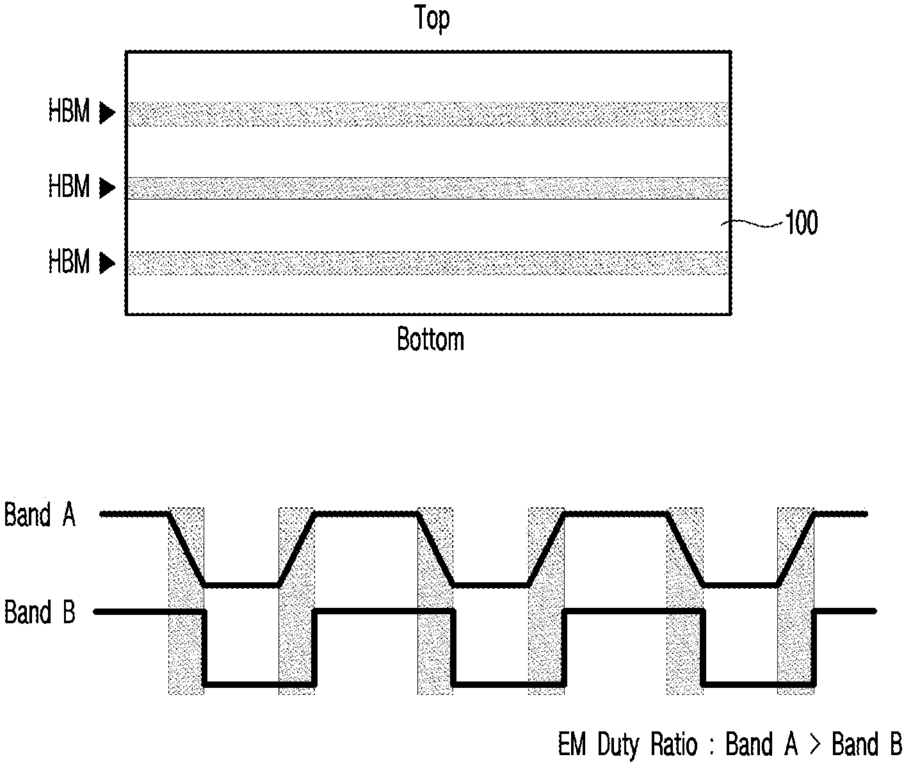
FIG. 13 is a diagram illustrating horizontal band mura (HBM) which is a luminance defect caused by coupling between a data line and a gate node of a driving transistor.

FIG. 13 is a diagram illustrating HBM which is a luminance defect caused by coupling between a data line and a gate node of a driving transistor.

Referring to FIG. 13, when a voltage of a data line DL is toggled from a data voltage Vdata to a first bias voltage Vpark in a vertical blank period, a gate voltage of a driving transistor may vary by a voltage variation of the data line in all subpixels SP of the display panel 100. However, only the luminance of pixel lines in the EM On state and emitting light may be affected by a gate voltage variation of the driving transistor, and due to this, HBM may appear.

Because an HBM phenomenon affects only the luminance of pixel lines including EM On pixels and emitting light, a thickness of HBM may be changed by an EM On duty ratio. In a high-luminance optical band (Band A) where an EM On duty ratio is relatively large, a luminance shift time (i.e., a time taken in decreasing luminance or a time taken in increasing luminance) affected by coupling may be long, and thus, a thickness of HBM may be relatively thicker.

On the other hand, in a low-luminance optical band (Band B) where an EM On duty ratio is relatively small, a luminance shift time (i.e., a time taken in decreasing luminance or a time taken in increasing luminance) affected by coupling may be short, and thus, a thickness of HBM may be relatively thinner.

An occurrence mechanism of HBM will be described below in detail with reference to FIGS. 14 to 16.

Figure 14:
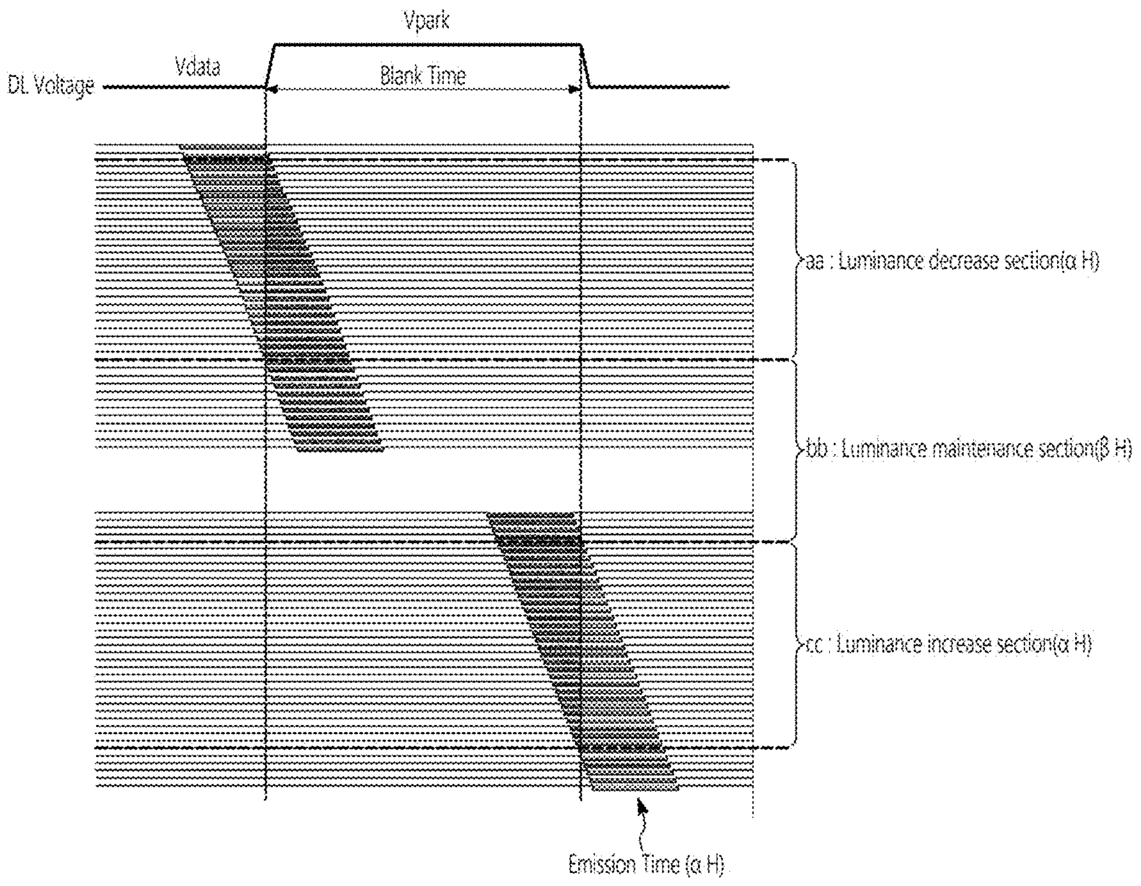
FIGS. 14 to 16 are diagrams for describing an occurrence mechanism of HBM.
Figure 15:
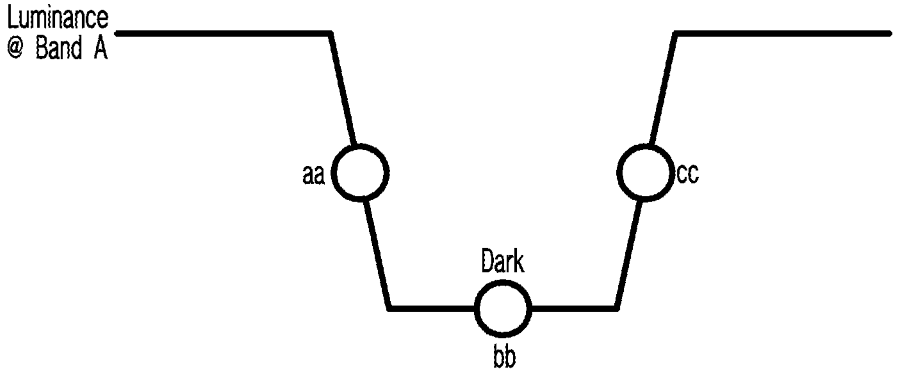

In aa of FIGS. 14 and 15, pixel lines of an EM On state may enter a vertical blank period, and thus, a period affected by a toggle influence caused by coupling may progressively increase. Accordingly, luminance may progressively decrease in an aa region.

Moreover, bb of FIGS. 14 and 15 represents a state where all pixel lines of the EM On state enters the vertical blank period. At this time, because a length of a period affected by a toggle influence caused by coupling is not changed to a maximum state, a state where luminance is low may be maintained.

In cc of FIGS. 14 and 15, the pixel lines of the EM On state may enter the vertical blank period, and thus, a period affected by a toggle influence caused by coupling may progressively decrease. Accordingly, luminance may progressively increase in a cc region.

Figure 16:
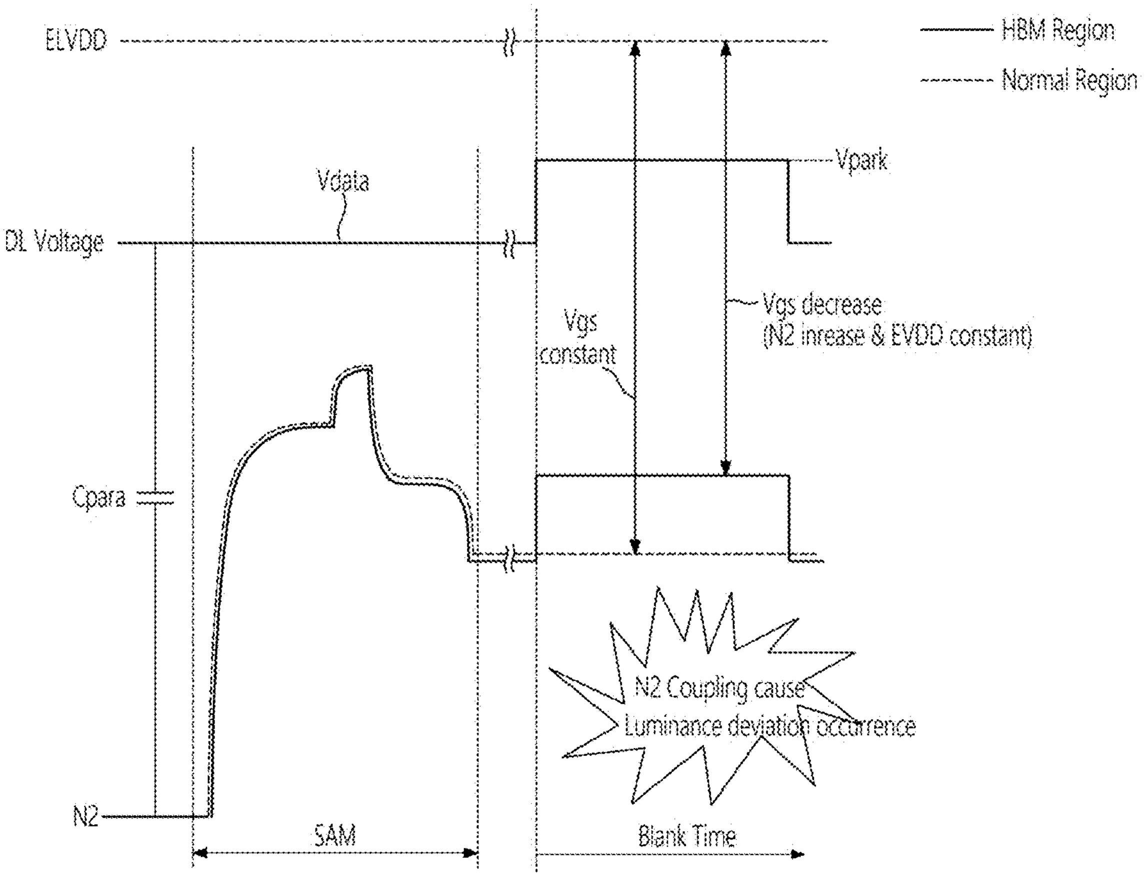

In FIGS. 14 to 16, for convenience of description, it is illustrated that an EM On/Off operation is performed once, but the EM On/Off operation may be performed a plurality of times in one frame. Accordingly, a plurality of HBM may appear in the display panel in the vertical blank period.

As in FIG. 16, a voltage variation of the data line DL may affect a gate voltage (N2 voltage) of the driving transistor (e.g., a voltage of N2 increases), and thus, the luminance of pixel lines emitting light in the vertical blank period may vary (for example, decrease), and a plurality of HBM may appear in the display panel.

Figure 17:
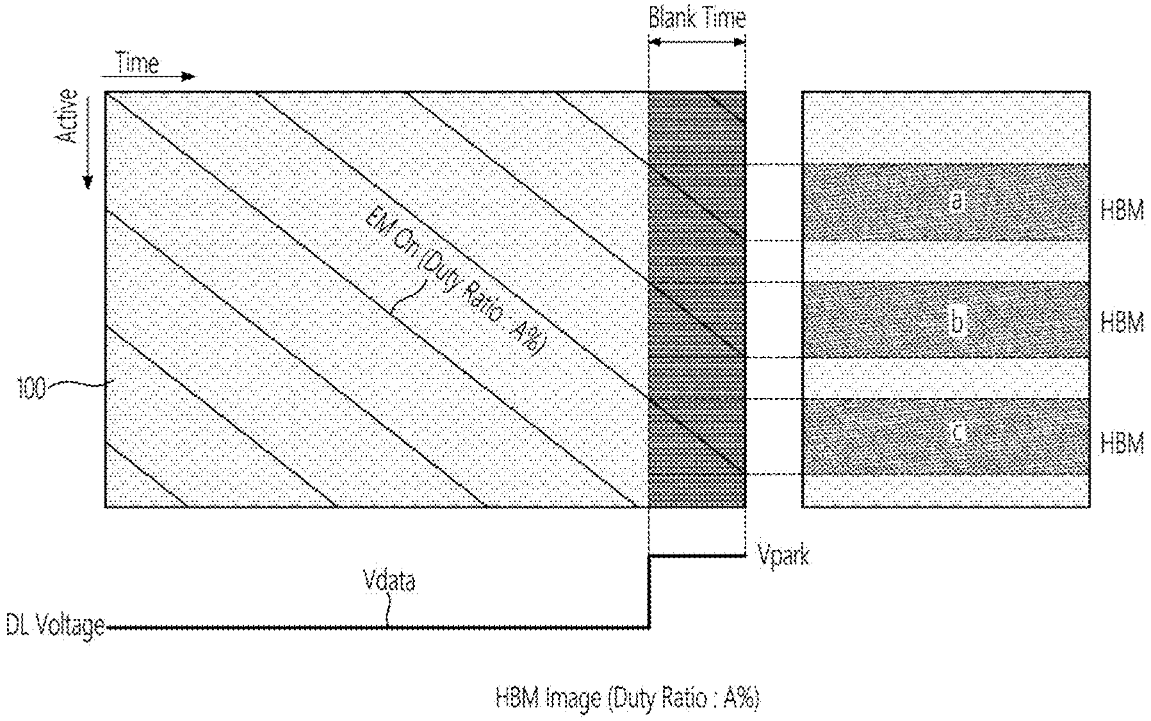
FIGS. 17 and 18 are diagrams illustrating an example where a shape of HBM is changed based on an on duty ratio of an emission control signal EM.
Figure 18:
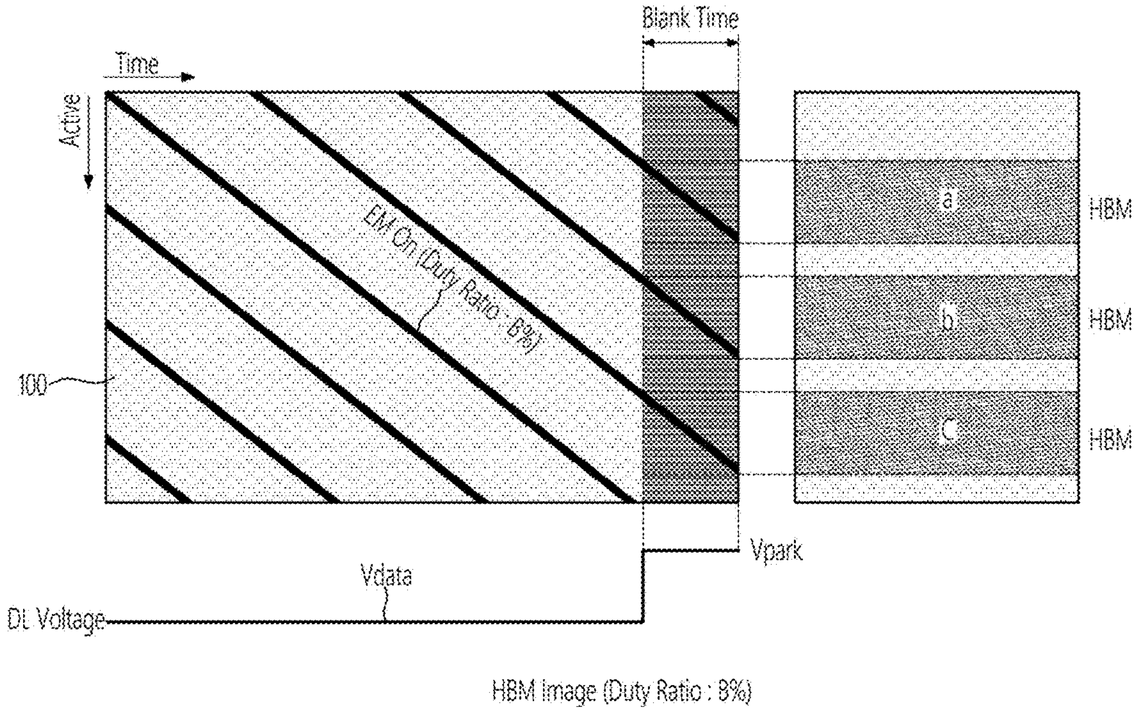

FIGS. 17 and 18 are diagrams illustrating an example where a shape of HBM is changed based on an EM On duty ratio.

As described above on an HBM mechanism, an HBM phenomenon may occur in only pixel lines of an EM On state, and thus, a shape of HBM may be changed based on a variation in EM On duty ratio.

FIG. 17 illustrates a case where an EM On duty ratio is A %, and FIG. 18 illustrates a case where an EM On duty ratio is B %. Comparing shapes of HBM with each other in a case of A<B, it may be seen that the number of pixel lines affected by coupling is relatively more in a case where an EM On duty ratio is B %, and thus, a shape of HBM enlarges more.

As in FIG. 17, a width of HBM in a case where an EM On duty ratio is A % may be a, b, and c, and as in FIG. 18, a width of HBM in a case where an EM On duty ratio is B % which is greater than A % may be A, B, and C. Here, a relationship of A>a, B>b, and C>c may be established.

Figure 19:
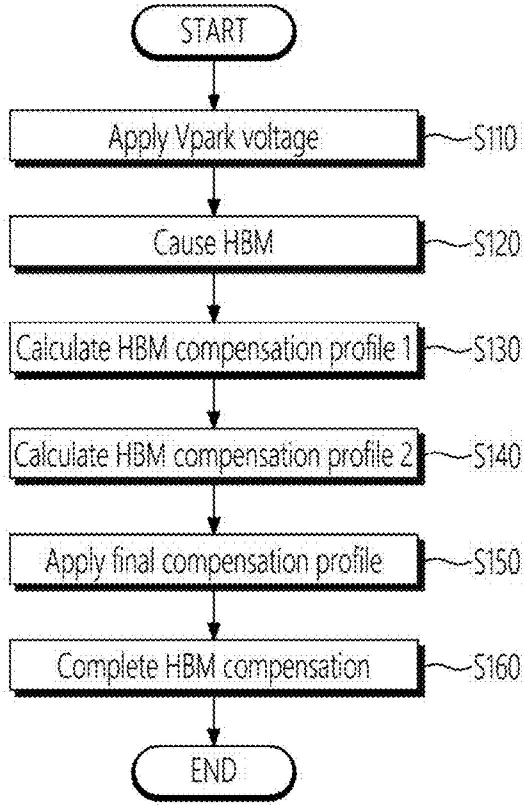
FIG. 19 is a diagram illustrating a driving method of a display device for decreasing HBM, according to the present disclosure.
Figure 20:
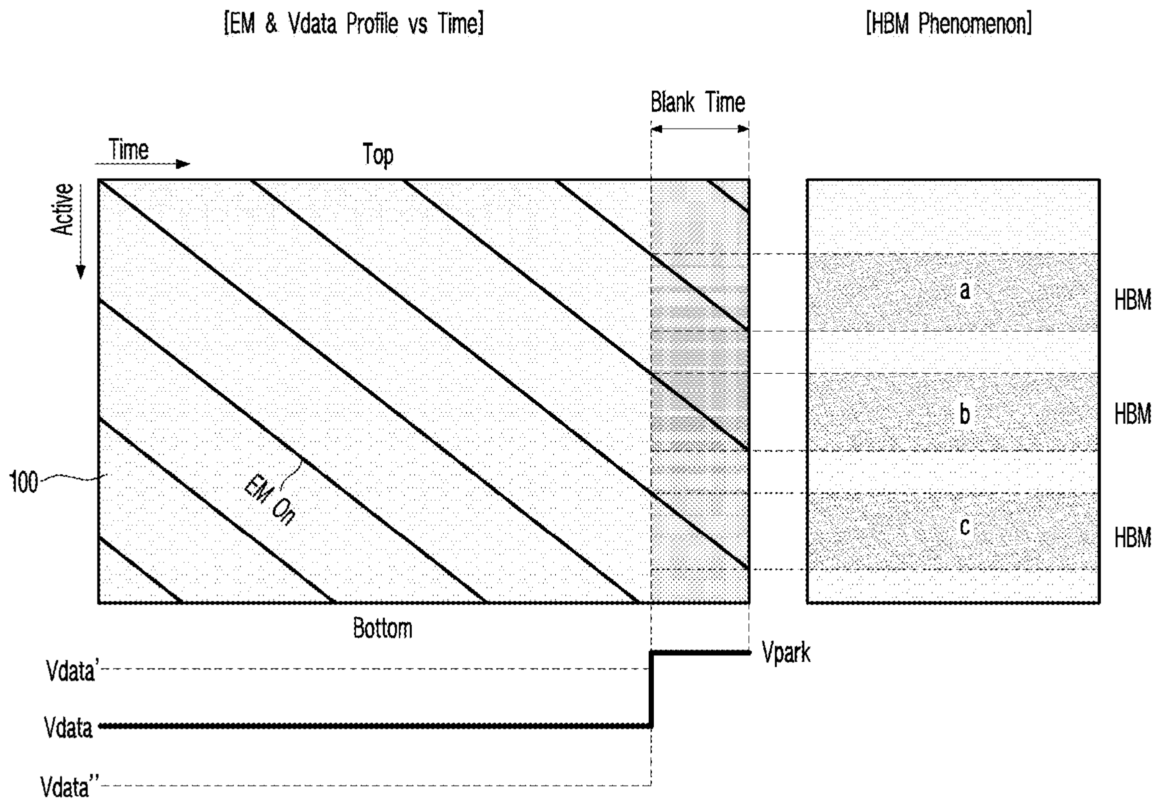
FIGS. 20 and 21 are diagrams illustrating HBM occurring when a voltage of a data line is toggled from a data voltage to a first bias voltage in a blank period or an anode reset frame.
Figure 21:
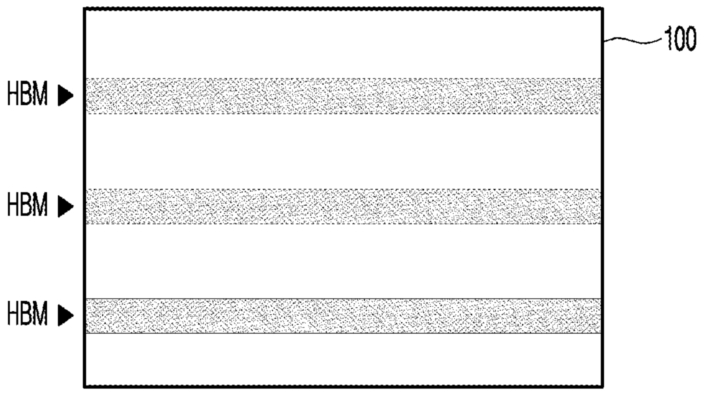
Figure 22:
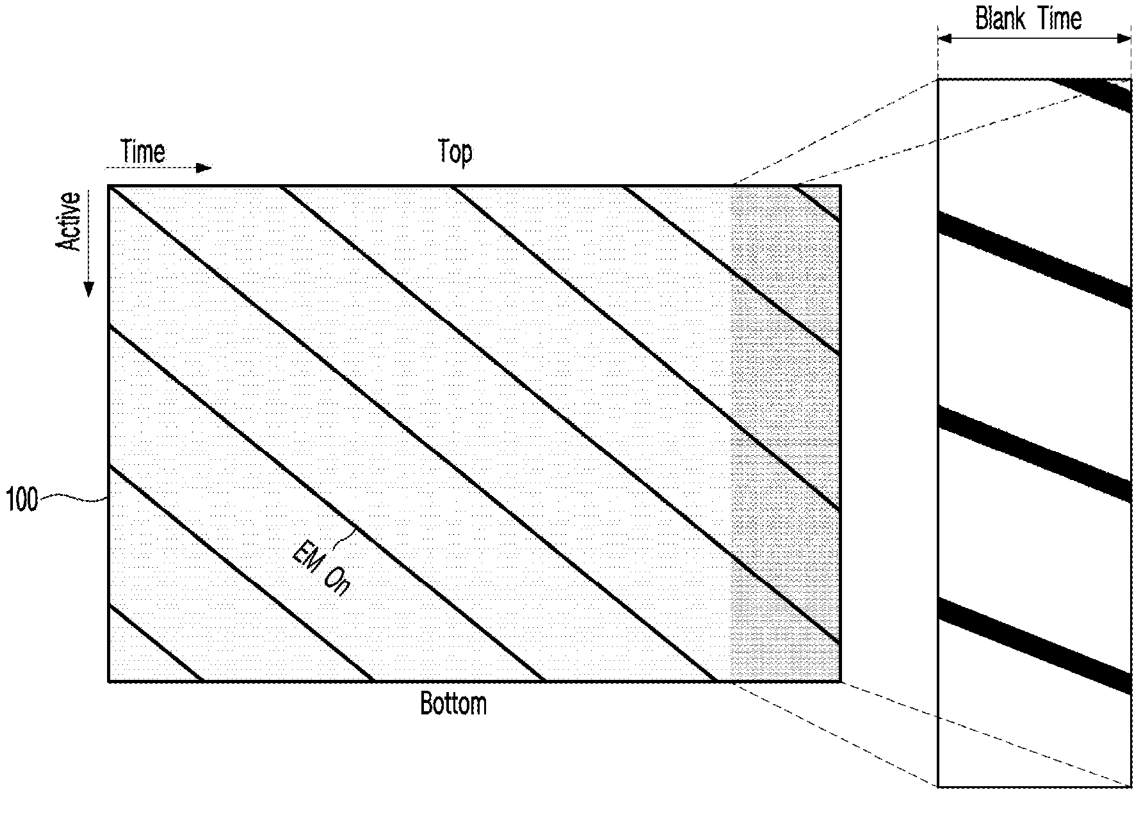
FIGS. 22 and 23 are diagrams illustrating an example which reflects an on duty ratio variation of an emission control signal EM to calculate an EM profile.
Figure 23:
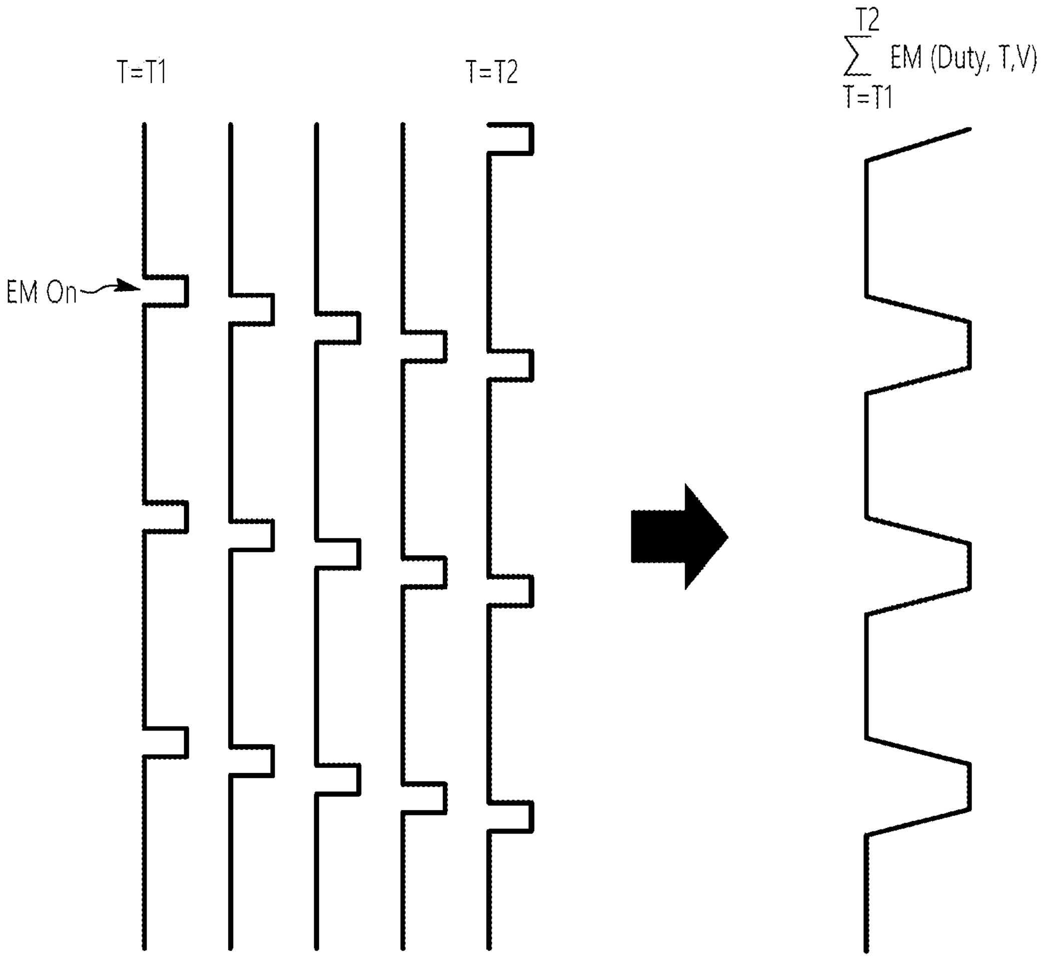
Figure 24:
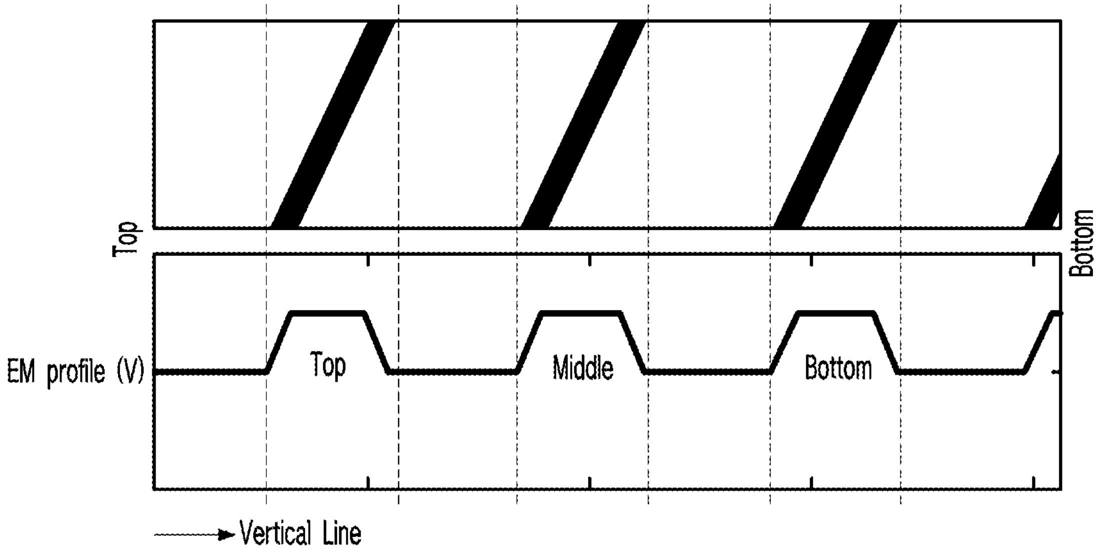
FIG. 24 is a diagram illustrating an example which calculates a compensation curve and an occurrence position of HBM, based on a sum of EM profiles accumulated during a blank period.
Figure 25:
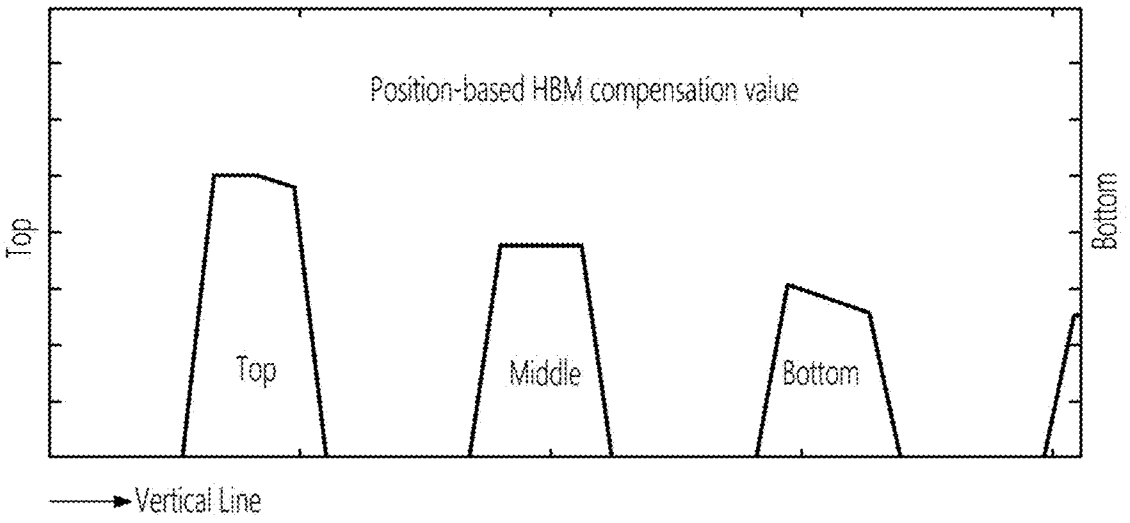
FIG. 25 is a diagram illustrating an example which applies an HBM compensation value based on a position to the calculated compensation curve to calculate a final compensation profile.
Figure 26:
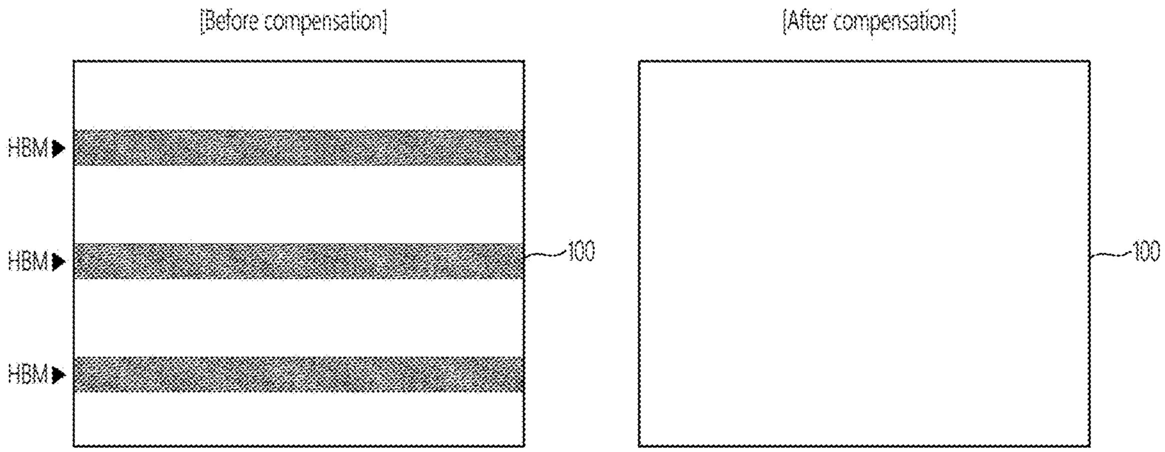
FIG. 26 is a diagram illustrating an example where HBM is reduced by a final compensation profile.

FIG. 19 is a diagram illustrating a driving method of a display device for decreasing HBM, according to the present disclosure. FIGS. 20 and 21 are diagrams illustrating HBM occurring when a voltage of a data line is toggled from a data voltage to a first bias voltage in a blank period or an anode reset frame. FIGS. 22 and 23 are diagrams illustrating an example which reflects an on duty ratio variation of an emission control signal EM to calculate an EM profile. FIG. 24 is a diagram illustrating an example which calculates a compensation curve and an occurrence position of HBM, based on a sum of EM profiles accumulated during a blank period. FIG. 25 is a diagram illustrating an example which applies an HBM compensation value based on a position to the calculated compensation curve to calculate a final compensation profile. FIG. 26 is a diagram illustrating an example where HBM is reduced by a final compensation profile.

Referring to FIGS. 19 and 20, when a first bias voltage Vpark is applied to a data line in a vertical blank period, a voltage of the data line may be toggled from a data voltage Vdata to the first bias voltage Vpark (S110).

The first bias voltage Vpark may be a voltage of a fixed level. On the other hand, the data voltage Vdata may be a voltage of a level which varies based on a gray level. A voltage variation of the data line may be changed based on a data gray level (i.e., a level of the data voltage). For example, in Vdata' of a voltage level which is higher than Vdata, a voltage variation may be relatively small, and in Vdata" of a voltage level which is lower than Vdata, a voltage variation may be relatively large.

In subpixels connected to the data line, a gate node of a driving transistor may be coupled to the data line through a parasitic capacitor. Based on a coupling effect, a voltage variation of the data line may be reflected in a voltage of the gate node of the driving transistor. Accordingly, a gate voltage of the driving transistor may vary, and thus, a gate-source voltage Vgs of the driving transistor may vary, and due to this, HBM may occur in the display panel 100 as in FIG. 21 (S120).

To calculate an HBM occurrence position, as in FIG. 22, a controller may calculate an EM profile in the vertical blank period (S130). In a case which calculates the EM profile, as in FIG. 23, the controller may reflect a variation of an EM On duty ratio (T1, T2, etc.) which varies based on a gray level and an optical band.

The controller may calculate the EM profile based on an EM On duty ratio of the vertical blank period, and thus, may effectively calculate a compensation profile, based on HBM where a shape is changed based on the EM On duty ratio.

The controller may accumulate the EM profile during the vertical blank period as in the following Equation 1 to calculate a compensation curve corresponding to the HBM occurrence position (S140).

$$EM_{profile}(V) = \sum_{T=T1}^{T2} EM(\text{duty}, T, V) \qquad \text{Equation 1}$$

As illustrated in FIG. 22, a coupling effect based on the first bias voltage Vpark may appear in the vertical blank period. Therefore, Equation 1 represents a sum $EM_{profile}$ (V) of the emission control signal EM for a vertical pixel row V accumulated up to a time "T=T2=T1+Blank" from a time "T=T1," wherein "T1" represents the start time of the blank period, "T2" represents the end time of the blank period, "EM(duty, T, V)" represents the emission control signal EM for the vertical pixel row V as a function of time T, "duty" refers to the duty ratio of the emission control signal EM, and "Blank" refers to the duration of the blank period. That is, a sum of accumulated emission control signal EM represents a right curve of FIG. 23. FIG. 24 is a compensation curve with respect to the vertical pixel line.

To provide an additional description, a graph which is shown in a vertical direction by accumulating EM profiles during the blank period (for example, with respect to 120 Hz, 8.33 msec) is the compensation curve of FIG. 24. An occurrence position of HBM may correspond to pixel lines of an EM On state and may be disposed at a top, a middle, and a bottom of the display panel. The compensation curve of FIG. 24 represents levels of compensation values for compensating for HBM at a plurality of positions. Accordingly, in the compensation curve, a compensation level between a nonoccurrence position and an occurrence position of HBM may differ.

HBM levels may differ for each position, based on IR drop (e.g., potential difference) effect. The controller may calculate a final compensation profile, further based on a position-based HBM level difference (S150).

To this end, the controller may calculate a position-based gain a so as to compensate for a position-based HBM level and may multiply an accumulation result of EM profiles by the position-based gain a to obtain a final compensation profile HBM IP(V) as in the following Equation 2.

$$HBM\ IP(V) = EM_{profile}(V) \times \alpha(V), \qquad \text{Equation 2}$$

$\alpha$: panel position-based gain

The controller, as in FIG. 25, may differently apply an HBM compensation value, based on the occurrence position of HBM. A magnitude of the HBM compensation value may be adjusted to be proportional to the amount of IR drop. When a level of IR drop is highest in a top in the display panel, is second high in a middle, and is lowest in a bottom, the controller may apply the HBM compensation value to be highest in the top, second high in the middle, and lowest in the bottom.

The controller may compensate for image data which is to be written at a corresponding position, based on HBM compensation data corresponding to each position at which HBM occurs, and thus, may complete an HBM compensation operation (S160). As a result, as in FIG. 26, a luminance deviation (HBM) occurring in the display panel 100 may be removed, and thus, image quality may be improved.

Figure 27:
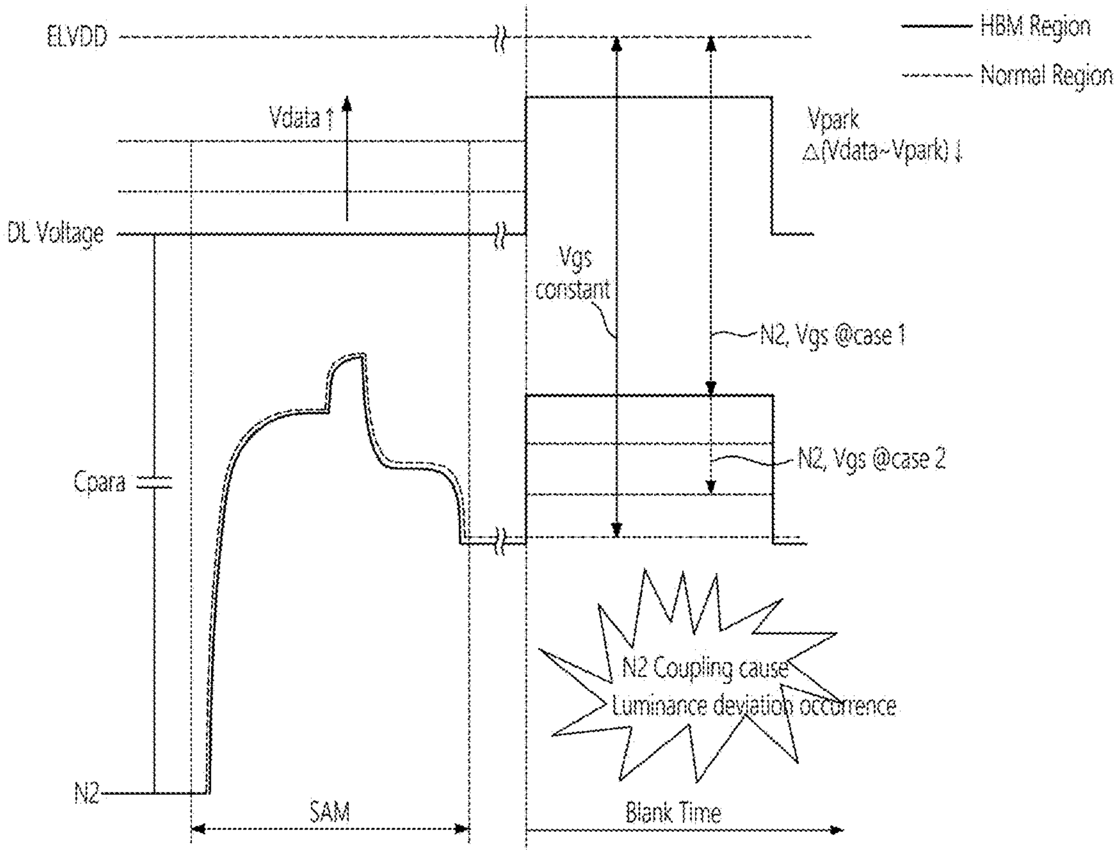
FIGS. 27 and 28 are diagrams illustrating an example where an HBM compensation value is differently set based on a display gray level and an optical band.
Figure 28:
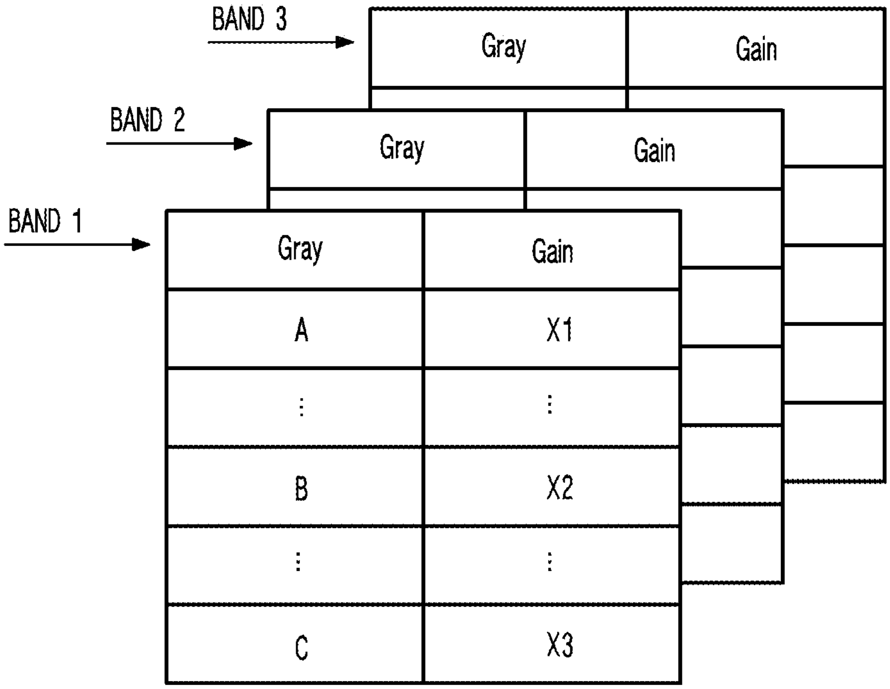

FIGS. 27 and 28 are diagrams illustrating an example where an HBM compensation value is differently set based on a display gray level and an optical band.

As described above, an HBM compensation algorithm may detect an HBM position by calculating an EM profile of a vertical blank period and may calculate and apply a compensation profile to a position at which HBM occurs, and thus, may compensate for HBM.

As in FIG. 27, HBM may occur due to coupling between a data line and an N2 node, and this may denote that a level of HBM varies based on a level of ΔVdata~Vpark. When a level of a first bias voltage Vpark is fixed and a level of a data voltage Vdata is shifted, a level of ΔVdata~Vpark may vary. Accordingly, the amount of coupling of the N2 node may vary, and this may finally cause a variation of a Vgs value of a driving transistor to affect a level of HBM.

The first bias voltage Vpark may be fixed to a specific value in the same optical band, and thus, a level of ΔVdata~Vpark may vary based on a display gray level and an optical band.

As in FIG. 28, a lookup table LUT may be configured, and when an optimal gain for each condition is applied, HBM may be compensated for and reduced regardless of display gray levels and optical bands 1, 2, and 3.

To this end, lookup tables LUT individually corresponding to representative optical bands 1, 2, and 3 may be provided. Different gain values may be respectively mapped to display gray levels in the lookup tables LUT individually corresponding to the representative optical bands 1, 2, and 3.

Moreover, gain values corresponding to each display gray of a band disposed between representative optical bands may be obtained by interpolating corresponding gain values of the representative optical bands.

Figure 29:
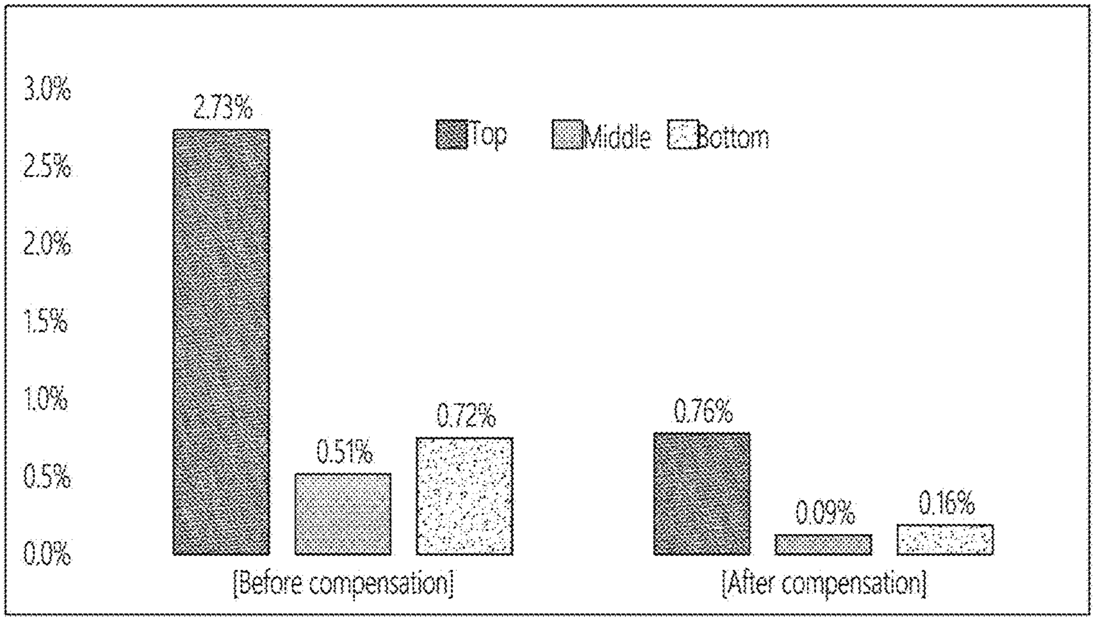
FIG. 29 is a diagram illustrating a luminance difference between before and after HBM compensation at representative positions of a display panel.

FIG. 29 is a diagram illustrating a luminance difference between before and after HBM compensation at representative positions of a display panel.

Referring to FIG. 29, it may be seen that a luminance variation width is largely improved by HBM compensation.

HBM occurring due to coupling between a data line and a gate node of a driving transistor may be notedly recognized in a low-luminance optical band, and as in the present embodiment, when an HBM compensation operation is performed in real time, HBM occurring due to a coupling influence may be effectively reduced in the low-luminance optical band.

Furthermore, the present embodiment may reduce an emission time through EM PWM driving and may increase a current flowing in a light emitting device, thereby decreasing luminance mura occurring in low-luminance driving.

The effects according to the present disclosure are not limited to the above examples, and other various effects may be included in the specification.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a display panel including:

a subpixel having a light emitting device configured to emit light according to an on duty ratio of an emission control signal and a driving transistor configured to supply a driving current to the light emitting device, and a data line connected to the subpixel;

a controller configured to:

obtain a compensation value for compensating for an abnormal luminance variation of the display panel based on coupling between a gate node of the driving transistor and the data line when a voltage of the data line is switched from a data voltage to a bias voltage in a vertical blank period of one frame, and correct a data signal which is to be written in the display panel, based on the compensation value; and a data driver configured to convert a corrected data signal into a data voltage and output the data voltage to the data line, wherein a gate voltage of the driving transistor varies based on a voltage variation of the data line.

2. The display device of claim 1, wherein, in the vertical blank period of the one frame, the controller calculates an emission control signal profile (EM profile) based on an on duty ratio of the emission control signal and detects a position at which an abnormal luminance variation occurs in the display panel.

3. The display device of claim 2, wherein, during the vertical blank period, the controller accumulates the EM profile to calculate the compensation value corresponding to the position at which the abnormal luminance variation occurs.

4. The display device of claim 3, wherein, during the vertical blank period, the controller reflects a position-based first gain value of the display panel based on IR drop in the compensation value.

5. The display device of claim 3, wherein, during the vertical blank period, the controller reflects a second gain value, independently set based on an optical band and a display gray level, in the compensation value.

6. A driving method of a display device having a display panel, the driving method comprising:

obtaining a compensation value for compensating for an abnormal luminance variation of a display panel based on coupling between a gate node of a driving transistor and a data line when a voltage of the data line is switched from a data voltage into a bias voltage in a vertical blank period of one frame, and correcting a data signal which is to be written in the display panel, based on the compensation value, wherein the data line is connected to a subpixel included in the display panel;

converting a corrected data signal into a data voltage; and outputting the data voltage to the data line, wherein a light emitting device included in the subpixel emits light according to an on duty ratio of an emission control signal, wherein a driving transistor included in the subpixel supplies a driving current to the light emitting device, and wherein a gate voltage of the driving transistor varies based on a voltage variation of the data line.

7. The driving method of claim 6, further comprising:

calculating, in the vertical blank period of the one frame, an EM profile based on an on duty ratio of the emission control signal; and detecting a position at which an abnormal luminance variation occurs in the display panel.

8. The driving method of claim 7, further comprising:

accumulating the EM profile to calculate the compensation value corresponding to the position at which the abnormal luminance variation occurs, during the vertical blank period.

9. The driving method of claim 8, further comprising:

reflecting a position-based first gain value of the display panel based on IR drop in the compensation value, during the vertical blank period.

10. The driving method of claim 8, further comprising:

reflecting a second gain value, independently set based on an optical band and a display gray level, in the compensation value during the vertical blank period.

11. A display device comprising:

a display panel including:

a subpixel having a light emitting device, an emission control transistor, and a driving transistor;

a scan line connected to a gate node of a first transistor;

a data line connected to a first node of a second transistor; and a controller, wherein a first node of the emission control transistor is connected to a second node of the driving transistor, a second node of the emission control transistor is connected to the light emitting device, and an emission control signal is applied to a gate node of the emission control transistor, and wherein the controller obtains a compensation value by integrating the emission control signal over a vertical blank period.

12. The display device of claim 11, wherein coupling between the gate node of the driving transistor and the data line occurs when a voltage of the data line is switched to a bias voltage in a vertical blank period.

* * * * *